United States Patent
Lau et al.

(10) Patent No.: US 10,926,324 B2
(45) Date of Patent: Feb. 23, 2021

(54) PRODUCTION OF SILICON NANO-PARTICLES AND USES THEREOF

(71) Applicant: Epro Development Limited, Kowloon (HK)

(72) Inventors: Albert Pui Sang Lau, Kowloon (HK); Lee Cheung Lau, Kowloon (HK)

(73) Assignee: Epro Development Limited, Kowloon (HK)

(*) Notice: Subject to any disclaimer, the term of this patent is extended or adjusted under 35 U.S.C. 154(b) by 118 days.

(21) Appl. No.: 16/068,107

(22) PCT Filed: Jul. 27, 2017

(86) PCT No.: PCT/CN2017/094619
§ 371 (c)(1),
(2) Date: Jul. 3, 2018

(87) PCT Pub. No.: WO2018/019266
PCT Pub. Date: Feb. 1, 2018

(65) Prior Publication Data
US 2019/0030600 A1 Jan. 31, 2019

(30) Foreign Application Priority Data
Jul. 27, 2016 (HK) .................... 16109004

(51) Int. Cl.
*B22F 1/00* (2006.01)
*B22F 9/04* (2006.01)
(Continued)

(52) U.S. Cl.
CPC .............. *B22F 1/0018* (2013.01); *B22F 9/04* (2013.01); *B22F 9/082* (2013.01); *C01B 33/021* (2013.01);
(Continued)

(58) Field of Classification Search
None
See application file for complete search history.

(56) References Cited

U.S. PATENT DOCUMENTS

2010/0092868 A1 4/2010 Kim et al.
2013/0153811 A1* 6/2013 Ikeda .................. H01L 35/16
252/62.3 T
(Continued)

FOREIGN PATENT DOCUMENTS

CN 101405088 A 4/2009
CN 102237519 A 11/2011
(Continued)

OTHER PUBLICATIONS

English text machine translation of Wu et al. (CN 102311121 A); accessed online from Espacenet, copy attached as PDF pp. 1-10. (Year: 2012).*
(Continued)

*Primary Examiner* — Katie L. Hammer
(74) *Attorney, Agent, or Firm* — Kolisch Hartwell, P.C.

(57) ABSTRACT

A process for producing silicon nano-particles from a raw silicon material, the process including steps of alloying the raw silicon material with at least one alloying metal to form an alloy; thereafter, processing the alloy to form alloy nano-particles; and thereafter, distilling the alloying metal from the alloy nano-particles whereby silicon nano-particles are produced.

5 Claims, 19 Drawing Sheets

(51) Int. Cl.
    *B22F 9/08*     (2006.01)
    *C01B 33/021*     (2006.01)
    *C22C 1/04*     (2006.01)
    *H01L 31/028*     (2006.01)
    *H01L 31/0384*     (2006.01)
    *H01L 31/0392*     (2006.01)
    *D06M 11/83*     (2006.01)
    *H01M 4/134*     (2010.01)
    *H01M 4/38*     (2006.01)
    *B82Y 30/00*     (2011.01)

(52) U.S. Cl.
    CPC .......... *C22C 1/0408* (2013.01); *C22C 1/0483* (2013.01); *D06M 11/83* (2013.01); *H01L 31/028* (2013.01); *H01L 31/03845* (2013.01); *H01L 31/03926* (2013.01); *H01M 4/134* (2013.01); *H01M 4/386* (2013.01); *B22F 2009/042* (2013.01); *B22F 2009/043* (2013.01); *B22F 2304/056* (2013.01); *B82Y 30/00* (2013.01); *C01P 2004/60* (2013.01)

(56) References Cited

U.S. PATENT DOCUMENTS

2013/0195746 A1* 8/2013 Chu ...................... C01B 33/029 423/347
2013/0196158 A1* 8/2013 Yoshida ............. H01M 4/0495 428/402
2013/0216907 A1* 8/2013 Rayner .................. C30B 29/06 429/211
2016/0164085 A1* 6/2016 Hanelt .................... B02C 17/20 429/218.1

FOREIGN PATENT DOCUMENTS

| | | | |
|---|---|---|---|
| CN | 102311121 A | * 1/2012 | |
| CN | 105399100 A | 3/2016 | |
| WO | WO-2015014749 A1 | * 2/2015 | ............ B02C 17/20 |
| WO | 2016139521 A1 | 9/2016 | |

OTHER PUBLICATIONS

European Patent Office, "Extended European Search Report" in connection with related European Patent Application No. 17833569.1, dated Apr. 15, 2019, 9 pgs.

Volkov, Yu P. et al., "Formation of Silicon Nanospheres in Molten Aluminum", Technical Physics, vol. 49, No. 3., 2004, pp. 358-360.

Hong Kong Polytechnic University, "Durable, washable and high-performance conductive textiles", http://phys.org/news/2015-05-durable-washable-high-performance-textiles.html, May 19, 2015, 1 pg.

Li, Haili, Authorized Officer, State Intellectual Property Office of the P.R. China, "International Search Report" in connection with related International Application No. PCT/CN2017/094619, dated Oct. 20, 2017, 3 pgs.

* cited by examiner

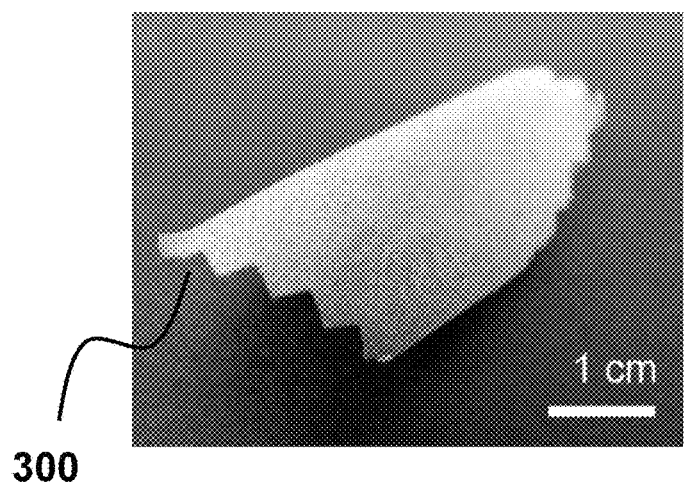
FIG. 10
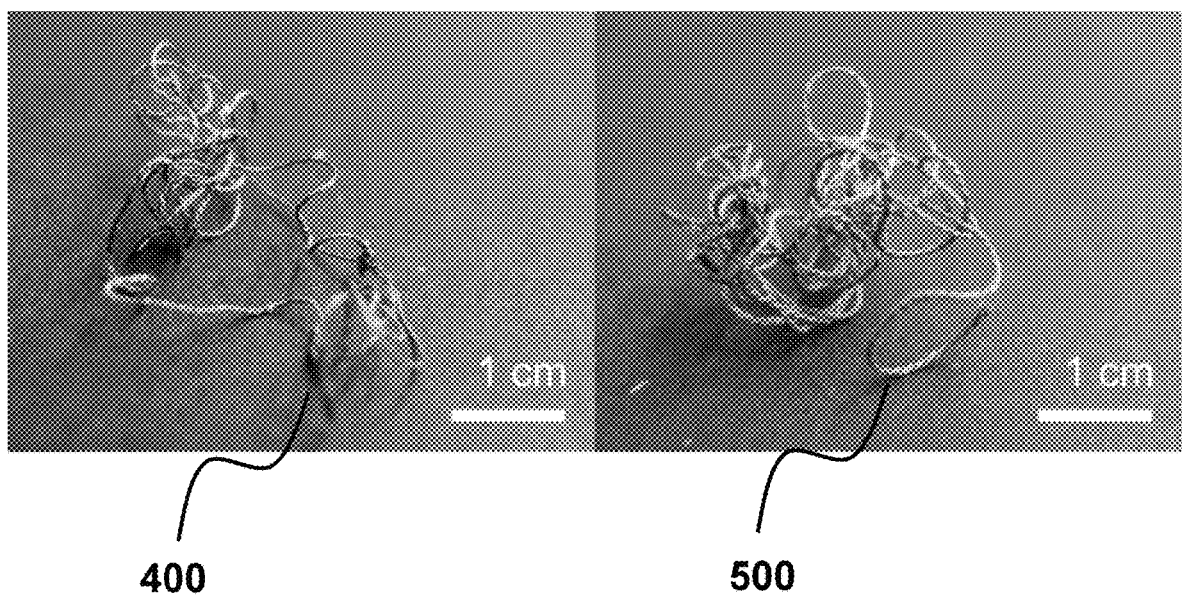
FIG. 11A   FIG. 11B

PRODUCTION OF SILICON NANO-PARTICLES AND USES THEREOF

TECHNICAL FIELD

The present invention relates to the production of silicon nano-particles as well as components and devices comprising such silicon nano-particles.

BACKGROUND OF THE INVENTION

Silicon nano-particles have a variety of commercial applications including for instance as a material for the manufacture of solar cell devices and anodic elements of battery devices. Certain methods currently used for large-scale production of silicon nano-particles involve the use of vapour deposition or atomization which tend to be relatively costly to implement at scale and such processes also tend to produce silicon nano-particles having undesirable microstructures which are unsuitable for solar cell and battery applications. Technology developed by Siemens (i.e. the "Siemens process") has been used for the production of silicon nano-particles which are of suitable purity for use in solar-cell applications. However, this process is perceived to be both relatively expensive and non-environmentally-friendly as it is estimated that approximately 200 MW·Hr of electricity is expended in order to produce 1 ton of solar-grade silicon. Carbothermic reduction processes have been developed as a potential alternative to the Siemens process, however, these processes do not produce silicon nano-particles that are of solar-grade quality since impurities such as boron and phosphorous, which are inherently contained in carbon, cannot be removed to suitably low levels (i.e. to levels in the parts-per-million or parts-per-billion). It would be appreciated that the relatively high costs associated with producing silicon nano-particles utilising current commercial methods also contributes to the overall manufacturing costs for solar cell and battery device components comprising silicon nano-particles and therefore a perceived need exists to address this problem.

It is also perceived that there are shortcomings associated with certain devices currently available on the market having components comprised of silicon nano-particles, apart from the production costs of such components. Solar cell devices for instance may typically comprise relatively rigid and bulky panel structures which renders them impractical to store, transport and install such devices. On the other hand, silicon is finding increasing usage as a substitute material for graphite in the anodes of rechargeable lithium-ion batteries due to its ability to store a much larger capacity of lithium ions than graphite during charging. However, when fully charged, silicon may typically expand to more than 3 times its ordinary volume which tends to break the electrical contacts within the anode as well as cause cracking in the silicon material via which moisture may seep into the anode to further compromises operation of the anode. One approach to alleviate this problem has been to simply charge the battery to only a partial amount of its full capacity to limit the amount of expansion of the silicon in the anode. Another approach has been to provide a mixture of graphite and silicon particles in the anodic material in seeking to strike a balance between improving lithium-ion storage capacity (by virtue of the silicon nano-particles) whilst alleviating the amount of overall expansion of the anodic material (by virtue of the graphite particles which expand to a much smaller extent than silicon). However, such approaches tend to make inefficient use of the overall potential storage capacity of the anodic material in the battery. Accordingly, there exists a perceived need to address the problem arising from expansion of silicon nano-particles in the anodic material of batteries in order to utilise the superior storage capacity of silicon anodic materials.

SUMMARY OF THE INVENTION

The present invention seeks to alleviate at least one of the above-described problems.

The present invention may involve several broad forms. Embodiments of the present invention may include one or any combination of the different broad forms herein described.

In one broad form the present invention provides a process for producing silicon nano-particles from a raw silicon material, the process including steps of:
(i) alloying the raw silicon material with at least one alloying metal to form an alloy;
(ii) processing the alloy to form alloy nano-particles; and
(iii) distilling the alloying metal from the alloy nano-particles whereby silicon nano-particles are substantially produced.

Preferably, step (ii) includes forming alloy particles having diameters approximately in the range of 100-150 nm.

Preferably, step (ii) may include ball milling the alloy to form the alloy nano-particles.

Preferably, step (ii) may be performed in a controlled environment to alleviate oxidisation of the alloy nano-particles. Typically, the controlled environment includes a milling chamber in which the alloy is being ball milled with at least one of an inert gas, oil, diesel, kerosene, dehydrated ethanol, N-Methyl-2-pyrrolidone ("NMP") and other suitable organic solvents disposed in the milling chamber.

Alternatively, the alloy may be in a liquid form and step (ii) may include atomisation of the alloy to form the alloy nano-particles.

Preferably, step (iii) may include distilling the alloying metal from the alloy nano-particles in a vacuum furnace.

Preferably, the silicon nano-particles produced in accordance with step (iii) may include diameters of approximately in the range of around 50 nm-150 nm diameter. In certain embodiments, a further optional step following step (iii) may be effected in which the silicon nano-particles may be subjected to a further milling process in a controlled environment to break apart a porous structure comprised by the nano-silicon particles. Preferably the controlled environment may include filling the milling chamber with dehydrated ethanol.

Preferably, the alloying metal may include at least one of zinc and magnesium.

In a further broad form, the present invention provides an apparatus for producing silicon nano-particles from a raw silicon material, the apparatus including:

an apparatus for alloying the raw silicon material with at least one alloying metal to form an alloy;

an apparatus for processing the alloy to form alloy nano-particles; and an apparatus for distilling the alloying metal from the alloy nano-particles whereby silicon nano-particles are produced.

Preferably, the apparatus for processing the alloy to form the alloy particles may be configured to form alloy nano-particles having diameters approximately in the range of 100-150 nm diameter.

Preferably, the apparatus for processing the alloy to form the alloy particles may include a ball milling apparatus having a milling chamber in which the alloy particles are able to be ball-milled in a controlled environment to alleviate oxidisation of the alloy nano-particles and/or explosion due to pressure build-up within the milling chamber.

Preferably, the apparatus may be configured for subjecting the silicon nano-particles to a milling process in a controlled environment to break apart a porous structure comprised by the nano-silicon particles.

Typically, the controlled environment may include the milling chamber in which the alloy is being ball milled having at least one of an inert gas, oil, diesel, kerosene, dehydrated ethanol, N-Methyl-2-pyrrolidone ("NMP") and other suitable organic solvents disposed therein.

Alternatively, the apparatus for processing the alloy to form the alloy nano-particles may include an apparatus for performing atomisation of the alloy when in a liquid form.

Preferably, the apparatus for distilling the alloying metal from the alloy nano-particles to produce the silicon nano-particles may include a vacuum furnace.

Preferably, the apparatus for distilling the alloying metal from the alloy nano-particles to produce the silicon nano-particles may be configured to produce silicon nano-particles having diameters of approximately in the range of around 50 nm-150 nm diameter.

Preferably, the alloying metal may include at least one of zinc and magnesium.

In another broad form the present invention provides a process for producing silicon nano-particles from a raw silicon material, the process including steps of:
  (i) alloying the raw silicon material with at least one alloying metal to form alloy ingots;
  (ii) distilling the alloy ingots to produce porous silicon ingots; and
  (iii) processing the porous silicon ingots to form silicon nano-particles.

Preferably, step (iii) includes milling the silicon ingots to form nano-silicon particles having diameters approximately in the range of around 50 nm-150 nm diameter. More preferably, the silicon ingots are processed by ball-milling the silicon ingots.

In a further broad form, the present invention provides an apparatus for producing silicon nano-particles from a raw silicon material, the apparatus including:
  an apparatus for alloying the raw silicon material with at least one alloying metal to form alloy ingots;
  an apparatus for distilling the alloy ingots to produce porous silicon ingots; and
  an apparatus for processing the porous silicon ingots to form silicon nano-particles.

Preferably, the apparatus for processing the porous silicon ingots to form silicon nano-particles includes an apparatus for milling the silicon ingots to form nano-silicon particles having diameters approximately in the range of 50 nm-150 nm diameter. More preferably, the apparatus includes a ball-milling apparatus.

In another broad form, the present invention provides a solar cell device for use in converting solar energy to electrical current, the solar cell device including:
  a photosensitive element comprising an n-type layer contiguously connected with a p-type layer at a junction region therebetween, the n-type layer and contiguously connected p-type layer of the photosensitive element being configured such that, in response to the photosensitive element being exposed to solar energy, free electrons are able to be released by the photosensitive element so as to provide current flow through a load device forming an external electrical circuit between the p-layer and p-layer of the photosensitive element;
  wherein said n-type layer and said p-type layer include at least one electrically-conductive substrate having silicon nano-particles deposited on a surface structure of the at least one electrically-conductive substrate.

Preferably, the electrically-conductive substrate may include a flexible structure. Also preferably, the electrically-conductive substrate may include a fabric layer comprising electrically-conductive textile elements. Preferably, the electrically-conductive textile elements may be formed by:
  (i) modifying a surface of the textile elements with a negatively-charged polyelectrolyte; and
  (ii) coating the modified surface of the textile element with metal particles.

Also preferably, the electrically-conductive textile elements may be configured to have surface structures formed from a coating of metal particles that may assist in trapping the silicon nano-particles that are deposited thereon. By way of example, the electrically-conductive textile elements may include a dendritic-type and/or a lattice-type surface structure disposed thereon formed by the coating of metal particles of the electrically-conductive textile elements which may be configured for receiving and/or trapping deposited silicon nano-particles and thereby assist in maintaining the silicon nano-particles on the surface structures of the electrically-conductive textile elements. Silicon nano-particles may for instance fill up and/or be trapped within recesses, pockets and faults in the surface structures of the electrically-conductive textile elements formed by the coating of metal particles. Furthermore, a plurality of electrically-conductive textile elements forming the electrically-conductive fabric may be configured to form composite textile elements (e.g. yarns, threads etc), for instance by intertwining the plurality of electrically-conductive textile elements, and silicon nano-particles deposited on to the composite electrically-conductive textile element of the fabric may be both received and/or trapped within the pockets of the surface structure of each individual textile element and also may be trapped and/or entangled between the surface structures of the intertwined textile elements. Any suitable techniques and processes may be used to form such surface structures on the electrically textile elements, for instance, during the process of coating the metal particles on to the natural or synthetic textile elements and suitably processing the metal particle coating so as to give rise to the desired surface structure characteristics, as described in other embodiments. Also preferably, the silicon nano-particles may be configured to provide a coating which may encapsulate the electrically conductive fabric and/or at least some of the electrically-conductive textile elements forming the fabric. Preferably, the electrically-conductive substrate may have an approximate thickness of less than 50 microns in the functional context of this particular broad form. Alternatively, in other embodiments, it is conceivable that the electrically-conductive substrate may not necessarily comprise electrically-conductive textile elements formed by depositing metal particles on to a natural or synthetic textile element, but may instead be formed by molding, drawing, pulling, and/or extruding elongate metal textile elements from a metal mass.

Preferably, the step (i) may include modifying the surface of the textile element with a negatively-charged polyelectrolyte by in-situ free radical polymerisation.

Preferably, the negatively-charged polyelectrolyte may include at least one of poly(methacrylic acid sodium salt) and poly(acrylic acid sodium salt).

Preferably, step (i) may includes modifying a silanized surface of a textile element with a negatively-charged polyelectrolyte.

Preferably, the step (ii) may include coating the modified surface of the textile element with metal particles by electroless metal deposition.

Preferably, the metal particles may include at least one of copper and nickel particles.

Preferably, the textile elements may include any suitable natural or man-made fibers or yarns, or, a blend or composite structure thereof comprising such natural or man-made fibers or yarns. Typically, the textile elements may include at least one of a polyester, nylon, cotton, silk, viscose rayon, wool, linen yarn or fiber, or any blend or composite structure thereof.

Preferably, the electrically-conductive textile elements forming the fabric layer may be woven together.

Preferably, the n-type and p-type layers include doped silicon nano-particles. Alternately, in certain embodiments, the silicon nano-particles may not necessarily need to be doped where for instance electron excitation is outsourced.

Preferably, the silicon nano-particles may be produced in accordance with any one of the broad forms of the present invention described herein.

Preferably, the silicon nano-particles may be printed or coated on to the at least one fabric layer to form the n-type and p-type layers.

Preferably, the n-type layer may be disposed on a first fabric layer and the p-type layer may be disposed on a second fabric layer, said first and second fabric layers comprising electrically-conductive textile elements.

Preferably, the present invention may include a transparent protective layer adjacent to the n-type layer.

Preferably, the present invention may include a transparent electrically-conductive layer configured for electrical communication with the n-type layer.

In a further broad form, the present invention provides a solar cell device for use in converting solar energy to electrical current, the solar cell having:

first and second electrically conductive terminals configured for electrical connection with a load device such that the electrical current is able to flow from the solar cell through the load device to power the load device; and a current generation module comprising a hole donor element and an electron donor element configured for generation of the electrical current in response to the current generation module being exposed to solar energy;

wherein the first electrically-conductive terminal includes a first electrically-conductive substrate having silicon nano-particles deposited thereon configured to function as the hole donor element, and, the second electrically-conductive terminal includes a second electrically-conductive substrate having silicon nano-particles deposited thereon configured to function as the electron donor element of the current generation module.

Preferably, the electrically-conductive substrate may include a flexible structure. Preferably, at least one of the first and second electrically-conductive substrates may include a fabric layer comprising electrically-conductive textile elements. Preferably the electrically-conductive substrate may have an approximate thickness of less than 50 microns in the functional context of this particular broad form.

Preferably, the electrically-conductive textile elements may be formed by:
(i) modifying a surface of the textile elements with a negatively-charged polyelectrolyte; and
(ii) coating the modified surface of the textile element with metal particles.

Also preferably, the electrically-conductive textile elements may be configured to have surface structures formed from a coating of metal particles that may assist in trapping the silicon nano-particles that are deposited thereon. By way of example, the electrically-conductive textile elements may include a dendritic-type and/or a lattice-type surface structure disposed thereon formed by the coating of metal particles of the electrically-conductive textile elements which may be configured for receiving and/or trapping deposited silicon nano-particles and thereby assist in maintaining the silicon nano-particles on the surface structures of the electrically-conductive textile elements. Silicon nano-particles may for instance fill up and/or be trapped within recesses, pockets and faults in the surface structures of the electrically-conductive textile elements formed by the coating of metal particles. Furthermore, a plurality of electrically-conductive textile elements forming the electrically-conductive fabric may be configured to form composite textile elements (e.g. yarns, threads etc), for instance by intertwining the plurality of electrically-conductive textile elements, and silicon nano-particles deposited on to the composite electrically-conductive textile element of the fabric may be both received and/or trapped within the pockets of the surface structure of each individual textile element and also may be trapped and/or entangled between the surface structures of the intertwined textile elements. Any suitable techniques and processes may be used to form such surface structures on the electrically textile elements, for instance, during the process of coating the metal particles on to the natural or synthetic textile elements and suitably processing the metal particle coating so as to give rise to the desired surface structure characteristics, as described in other embodiments. Also preferably, the silicon nano-particles may be configured to provide a coating which may encapsulate the electrically conductive fabric and/or at least some of the electrically-conductive textile elements forming the fabric. Preferably, the electrically-conductive substrate may have an approximate thickness of less than 50 microns in the functional context of this particular broad form. Alternatively, in other embodiments, it is conceivable that the electrically-conductive substrate may not necessarily comprise electrically-conductive textile elements formed by depositing metal particles on to a natural or synthetic textile element, but may instead be formed by molding, drawing, pulling, and/or extruding elongate metal textile elements from a metal mass.

Preferably, the step (i) may include modifying the surface of the textile element with a negatively-charged polyelectrolyte by in-situ free radical polymerisation. Preferably, the negatively-charged polyelectrolyte may include at least one of poly(methacrylic acid sodium salt) and poly(acrylic acid sodium salt).

Preferably, step (i) may include modifying a silanized surface of a textile element with a negatively-charged polyelectrolyte.

Preferably, the step (ii) may include coating the modified surface of the textile element with metal particles by electroless metal deposition.

Preferably, the metal particles may include at least one of copper and nickel particles.

Preferably, the textile elements may include any suitable natural or man-made fiber or yarn, or combination thereof.

Preferably, the textile elements may include at least one of a polyester, nylon, cotton, silk, viscose rayon, wool, linen yarn or fiber.

Preferably, the electrically-conductive textile elements forming the fabric layer may be woven together.

Preferably, the silicon nano-particles may be produced in accordance with any one of the processes described herein.

Preferably, the silicon nano-particles may be deposited on to the at least one fabric layer.

Preferably, the first electrically-conductive terminal may be formed from a first fabric layer comprising electrically-conductive textile elements, and the second electrically conductive-terminal is formed from a second fabric layer comprising electrically-conductive textile elements.

Preferably, the present invention may include a transparent protective layer.

In a further broad form, the present invention provides a method of producing an electrically-conductive textile element including the steps of:
 (i) modifying a surface of a textile element with a negatively-charged polyelectrolyte; and
 (ii) coating the modified surface of the textile element with metal particles.

Preferably, the step (i) may include modifying the surface of the textile element with a negatively-charged polyelectrolyte by in-situ free radical polymerisation.

Preferably, the negatively-charged polyelectrolyte may include at least one of poly(methacrylic acid sodium salt) and poly(acrylic acid sodium salt).

Preferably, the step (i) may include modifying a silanized surface of a textile element with a negatively-charged polyelectrolyte.

Preferably, the step (ii) may include coating the modified surface of the textile element with metal particles by electroless metal deposition.

Preferably, the metal particles may include at least one of copper and nickel particles.

Preferably, the textile elements may include any suitable natural or man-made fibers or yarns, or, a blend or composite structure of any such natural or man-made fibers or yarns configured for being formed into a fabric.

Typically, the textile elements may include at least one of a polyester, nylon, cotton, silk, viscose rayon, wool, linen yarn or fiber, or any blend or composite structure thereof.

In a further broad form, the present invention provides an apparatus for producing an electrically-conductive textile element including:
 an apparatus for modifying a surface of a textile element with a negatively-charged polyelectrolyte; and
 a coating apparatus for coating the modified surface of the textile element with metal particles.

Preferably, the apparatus for modifying the surface of the textile element with the negatively-charged polyelectrolyte may be configured to modify the surface of the textile element with a negatively-charged polyelectrolyte by in-situ free radical polymerisation.

Preferably, the negatively-charged polyelectrolyte may include at least one of poly(methacrylic acid sodium salt) and poly(acrylic acid sodium salt).

Preferably, the apparatus for modifying the surface of the textile element with the negatively-charged polyelectrolyte may be configured to modify a silanized surface of a textile element with a negatively-charged polyelectrolyte.

Preferably, the coating apparatus may be configured to coat the modified surface of the textile element with metal particles by electroless metal deposition.

Preferably, the metal particles may include at least one of copper and nickel particles.

Preferably, the textile elements may include any suitable natural or man-made fibers or yarns, or, a blend or composite structure of any such natural or man-made fibers or yarns.

Typically, the textile elements may include at least one of a polyester, nylon, cotton, silk, viscose rayon, wool, linen yarn or fiber, or any blend or composite structure thereof.

In a further broad form, the present invention provides an electrically-conductive textile element produced in accordance with the method steps of the first broad form of the present invention.

In a further broad form, the present invention provides a fabric formed from at least one textile element wherein the at least one textile element is produced in accordance with the method steps of any one of the broad forms of the present invention. Typically, the fabric may have an approximate thickness of less than 100 microns.

In a further broad form, the present invention provides a battery device including an anode element comprising an electrically-conductive substrate having a surface structure formed by a coating of metal particles that is configured for trapping silicon nano-particles deposited thereon. Preferably, the silicon nano-particles may be adapted to encapsulate the surface structure of the electrically-conductive substrate. By way of example, the electrically-conductive textile elements of the substrate may include a dendritic-type and/or a lattice-type surface structure disposed thereon formed by the metal particles of the electrically-conductive textile elements which may be configured for receiving and/or trapping deposited silicon nano-particles and thereby assist in retaining the silicon nano-particles on the surface structures of the electrically-conductive textile elements. Silicon nano-particles may for instance fill up and/or be trapped within recesses, pockets and faults in the surface structures of the electrically-conductive textile elements formed by the coating of metal particles. Furthermore, a plurality of electrically-conductive textile elements forming the electrically-conductive fabric may be configured to form composite textile elements (e.g. yarns, threads etc), for instance by intertwining the plurality of electrically-conductive textile elements, and silicon nano-particles deposited on to the composite electrically-conductive textile element of the fabric may be both received and/or trapped within the pockets of the surface structure of each individual textile element and also may be trapped and/or entangled between the surface structures of the intertwined textile elements. Any suitable techniques and processes may be used to form such surface structures on the electrically textile elements, for instance, during the process of coating the metal particles on to the natural or synthetic textile elements and suitably processing the metal particle coating so as to give rise to the desired surface structure characteristics, as described in other embodiments. Also preferably, the silicon nano-particles may be configured to provide a coating which may encapsulate the electrically conductive fabric and/or at least some of the electrically conductive textile elements forming the fabric. Preferably, the electrically-conductive substrate may have an approximate thickness of less than 100 microns.

Preferably, the electrically-conductive substrate may include a flexible structure.

Preferably, the electrically-conductive substrate may include a fabric layer comprising electrically-conductive textile elements.

Preferably, the electrically-conductive textile elements of the electrically-conductive substrate may be formed by:
(i) modifying a surface of the textile elements with a negatively-charged polyelectrolyte; and
(ii) coating the modified surface of the textile element with metal particles.

Preferably, the step (i) may include modifying the surface of the textile element with a negatively-charged polyelectrolyte by in-situ free radical polymerisation.

Preferably, the negatively-charged polyelectrolyte may include at least one of poly(methacrylic acid sodium salt) and poly(acrylic acid sodium salt).

Preferably, step (i) may include modifying a silanized surface of a textile element with a negatively-charged polyelectrolyte.

Preferably, the step (ii) may include coating the modified surface of the textile element with metal particles by electroless metal deposition.

Preferably, the metal particles may include at least one of copper and nickel particles.

Preferably, the textile elements may include any suitable natural or man-made fiber or yarn, or combination thereof.

Typically, the textile elements may include at least one of a polyester, nylon, cotton, silk, viscose rayon, wool, linen yarn or fiber, or any blend or composite structure thereof.

Preferably, the electrically-conductive textile elements forming the fabric layer may be woven together.

Preferably, the silicon nano-particles may be produced in accordance any one of the broad forms of the present invention described herein.

Preferably, a supersonic beam may be utilised during the deposition of the silicon nano-particles on to the electrically-conductive substrate.

In a further broad form, the present invention provides an anode element for use in a battery device according to any one of the broad forms of the present invention.

BRIEF DESCRIPTION OF THE DRAWINGS

The present invention will become more fully understood from the following detailed description of a preferred but non-limiting embodiment thereof, described in connection with the accompanying drawings, wherein:

FIG. 10 depicts a PMANa-assisted nickel-coated cotton fabric produced in accordance with an embodiment of the present invention;

FIG. 11A depicts an exemplary PAANa-assisted copper-coated yarn formed in accordance with an embodiment of the present invention;

FIG. 11B depicts an exemplary PAANa-assisted nickel-coated silk yarn formed in accordance with an embodiment of the present invention;

DETAILED DESCRIPTION OF THE EXEMPLARY EMBODIMENTS

Exemplary embodiments of the present invention will now be described with reference to the FIGS. 1 to 25.

Figure 1:
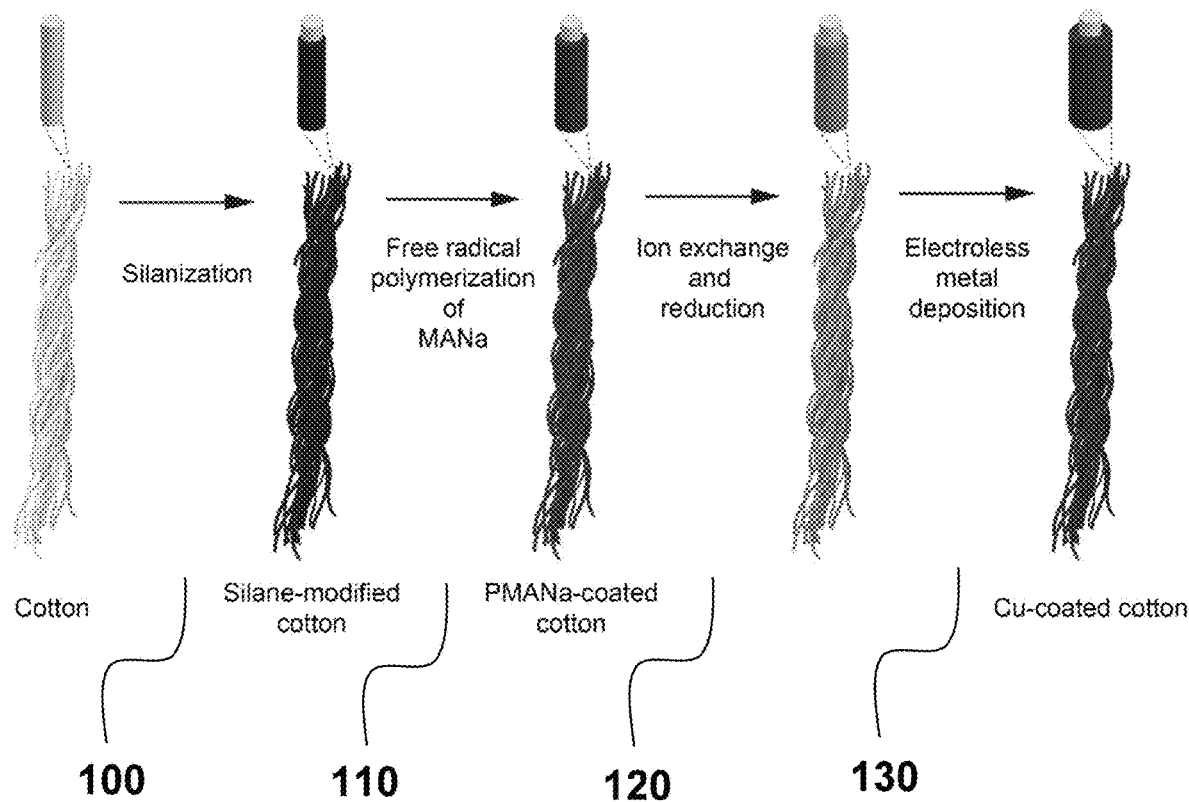
FIG. 1 is a schematic illustration of a process of preparing electrically-conductive cotton yarns via in-situ free radical polymerization in accordance with an embodiment of the present invention.
Figure 2:
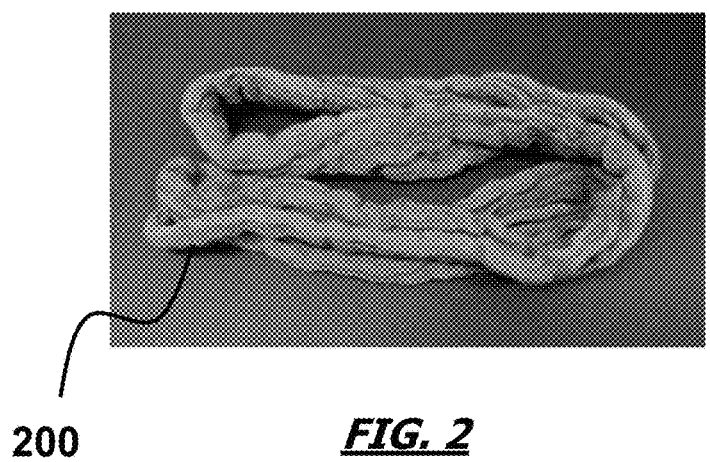
FIG. 2 depicts an exemplary copper-coated cotton yarn fabricated in accordance with the method depicted in FIG. 1.

Referring firstly to FIG. 1, a procedure for preparing PMANa polyelectrolytes on textile substrates such as cotton yarn is illustrated schematically. The embodiment involves an in-situ free radical polymerization method which may be performed upon cotton yarns by way of example to prepare poly(methacrylic acid sodium salt) (PMANa)-coated cotton yarns. Subsequent ion exchange, ion reduction and electroless deposition of metal particles onto the PMANa-coated cotton yarns may then be performed in order to yield electrically-conductive cotton yarns of suitable quality for production on a commercial scale. It should be noted that this embodiment may also be applicable to the preparation of PAANa polyelectrolytes on textile substrates.

In performing the process, cotton yarns are first immersed in a solution of 5-20% (v/v) C=C bond bearing silane for approximately 30 minutes so as to allow the hydroxyl groups of cellulose to suitably react with the silane molecules. The cotton yarns are then rinsed thoroughly with fresh deionized (DI) water so as to remove any excess physical adsorbed silane and by-product molecules. This step of silanisation is represented by (100) in FIG. 1.

The rinsed cotton yarns are then placed into an oven at 100-120° C. for between approximately 15-30 minutes to complete the condensation reaction. Subsequently, the silane-modified cotton yarns are immersed into approximately 50 mL aqueous solution comprising of 3-7 g of MANa powder and 35-75 mg of $K_2S_2O_8$ (similarly, AANa powder may be used in respect of PAANa polyelectrolytes). The whole solution mixture with cotton yarns is heated at 60-80° C. in an oven for 0.5-1 hour in order to carry out the free radical polymerization. In the free radical polymerization process, the double bond of silane can be opened by the free radicals resulting in the growth of PMANa polyelectrolyte onto the cotton fiber surface. This step of free radical polymerisation is represented by (110) in FIG. 1.

Thereafter, the PMANa-coated cotton yarns are immersed into a 39 g/L copper(II) sulphate pentahydrate solution for 0.5-1 hour, where the $Cu^{2+}$ ions are immobilized onto the polymer by ion exchange. Followed by reduction in 0.1-1.0 M sodium borohydride solution, $Cu^{2+}$ will be reduced to Cu particles which act as nucleation sites for the growth of Cu in the subsequent electroless deposition of Cu. This step of ion exchange and reduction is represented by (120) in FIG. 1.

The polymer-coated cotton after reduction in sodium borohydride solution is immersed in a copper electroless plating bath consisting of 12 g/L sodium hydroxide, 13 g/L copper(II) sulphate pentahydrate, 29 g/L potassium sodium tartrate, and 9.5 mL/L formaldehyde in water for 60-180 minutes. The as-synthesized Cu-coated yarns are rinsed with deionized (DI) water and blown dry. The step of performing electroless metal deposition is represented by (130) in FIG. 1 and an exemplary Cu-coated cotton yarn produced in accordance with the methods steps of this first embodiment is represented by (200) in FIG. 2.

Figure 3:
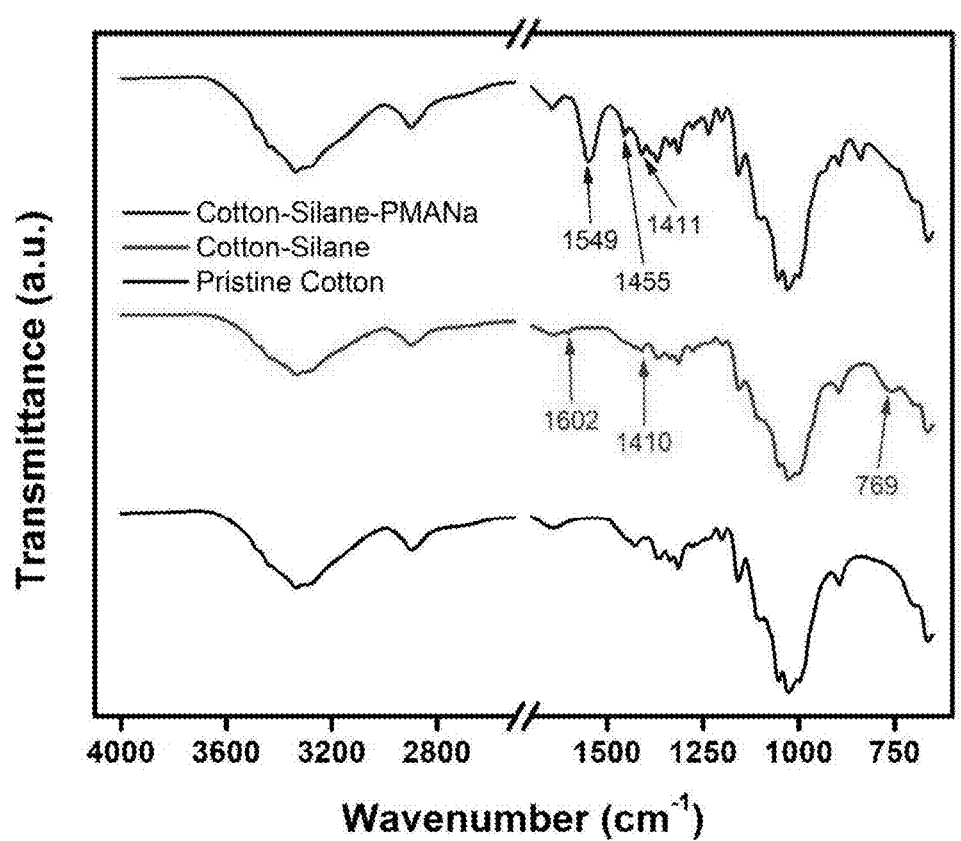
FIG. 3 depicts a representation of Fourier transform infrared spectroscopy (FTIR) spectra data in respect of pristine cotton yarns, silane-modified cotton, and PMANa-modified cotton yarns formed in accordance with an embodiment of the present invention.

The silane-modified cotton and PMANa-grafted cotton are able to be characterized by Fourier transform infrared spectroscopy (FTIR). As shown in FIG. 3, the presence of additional peaks located at 1602 and 1410 cm-1 represent C=C bonds in the silane molecules. Another distinctive peak located at 769 cm-1 is attributed to Si—O—Si symmetric stretching, indicating that the silane molecules are successfully cross-linked with each other on the cotton fiber surface. For the PMANa-modified cotton sample, a new peak located at 1549 cm-1 standing for carboxylate salt asymmetrical stretching vibrations confirm the PMANa grafting. Other peaks located at 1455 and 1411 cm-1 are both attributed to carboxylate salt symmetrical stretching vibrations from the PMANa.

Figure 4:
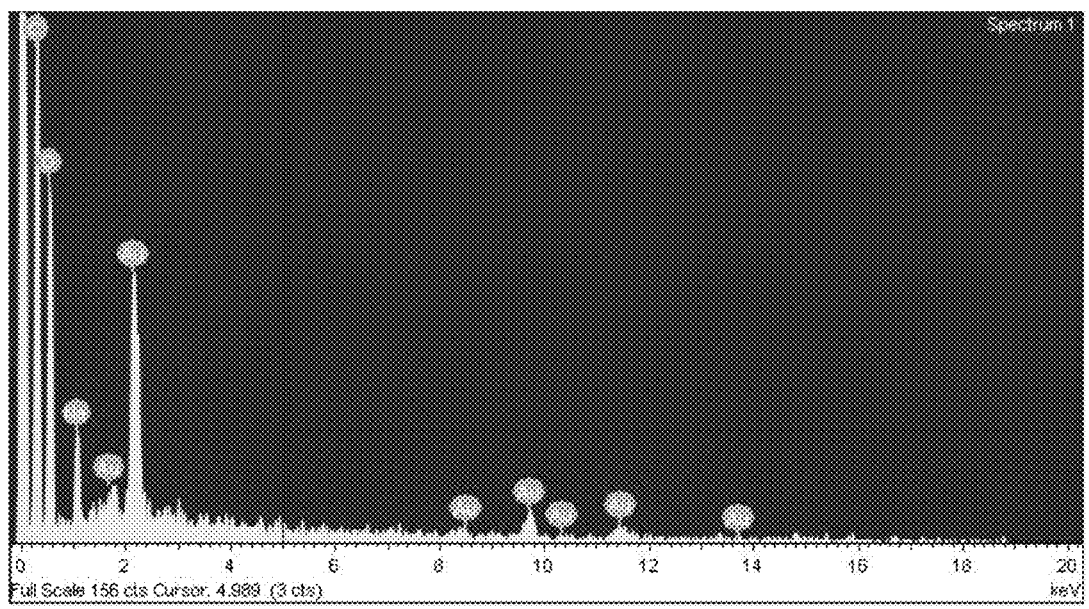
FIG. 4 depicts a representation of EDX spectrum of PMANa-modified cotton produced in accordance with an embodiment of the present invention.
Figure 5:
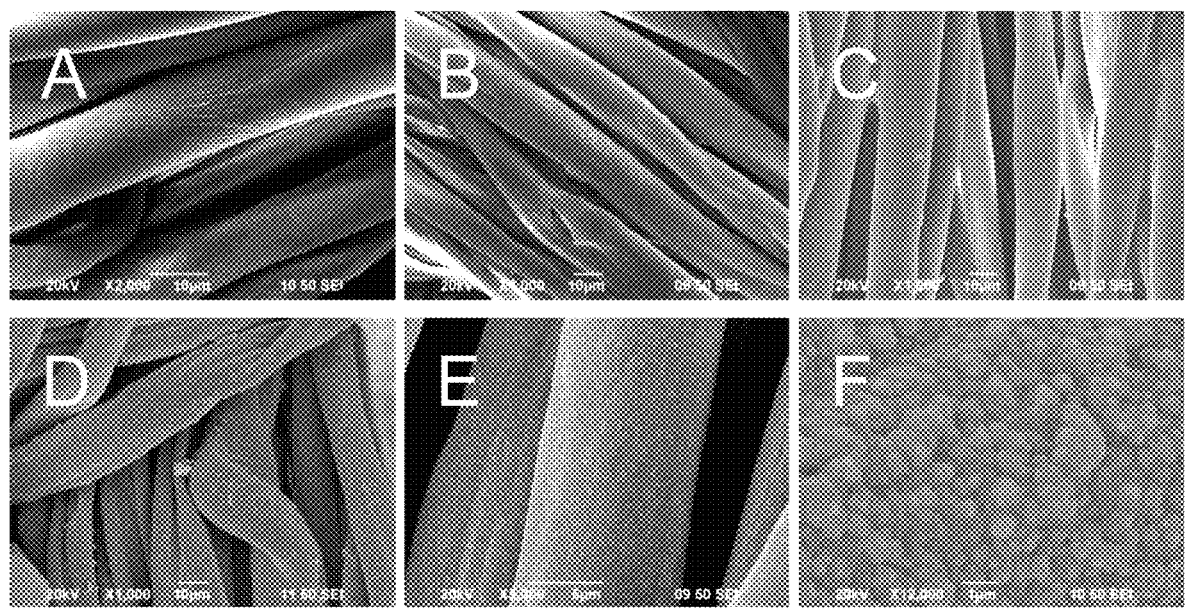
FIG. 5 depicts SEM images representing surface morphologies of cotton fibers with different modifications including (A) pristine cotton; (B) silane-modified cotton; (C) PMANa-coated cotton; (D-F) copper-coated cotton in accordance with an embodiment of the present invention.
Figure 6:
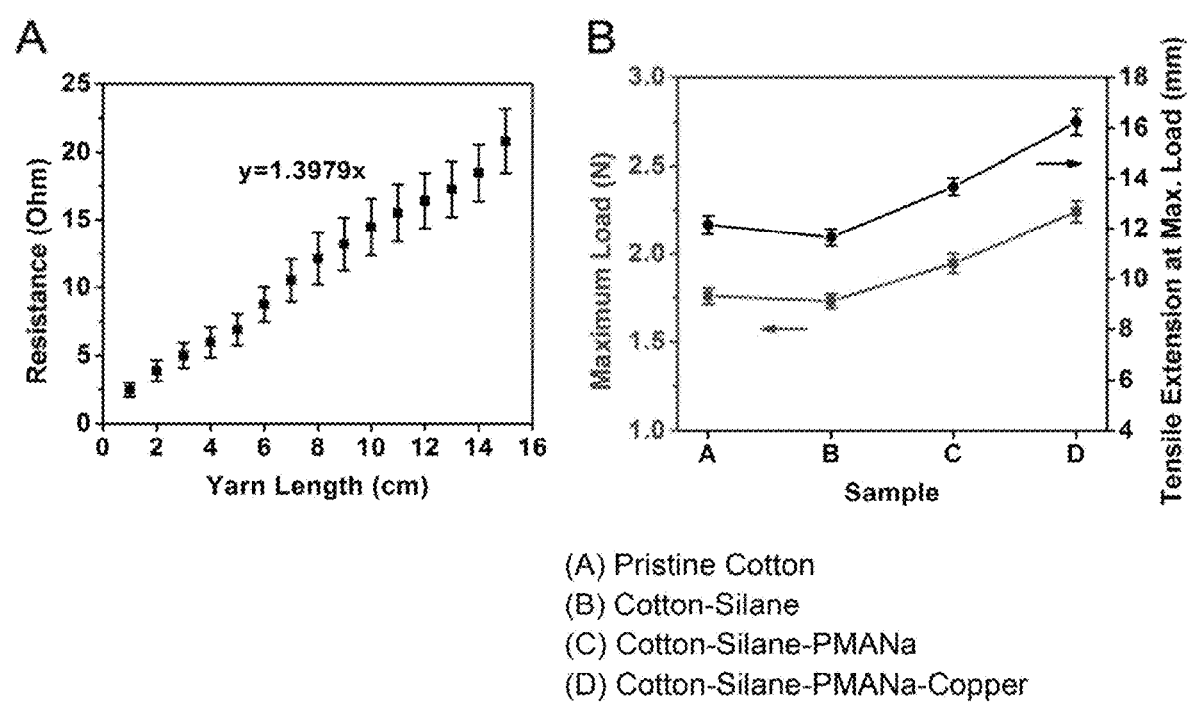
FIG. 6 depicts data representing (A) linear resistance of the as-synthesized copper-coated cotton yarns and (B) Tensile strength of the cotton yarns produced in accordance with an embodiment of the present invention.
Figure 7:
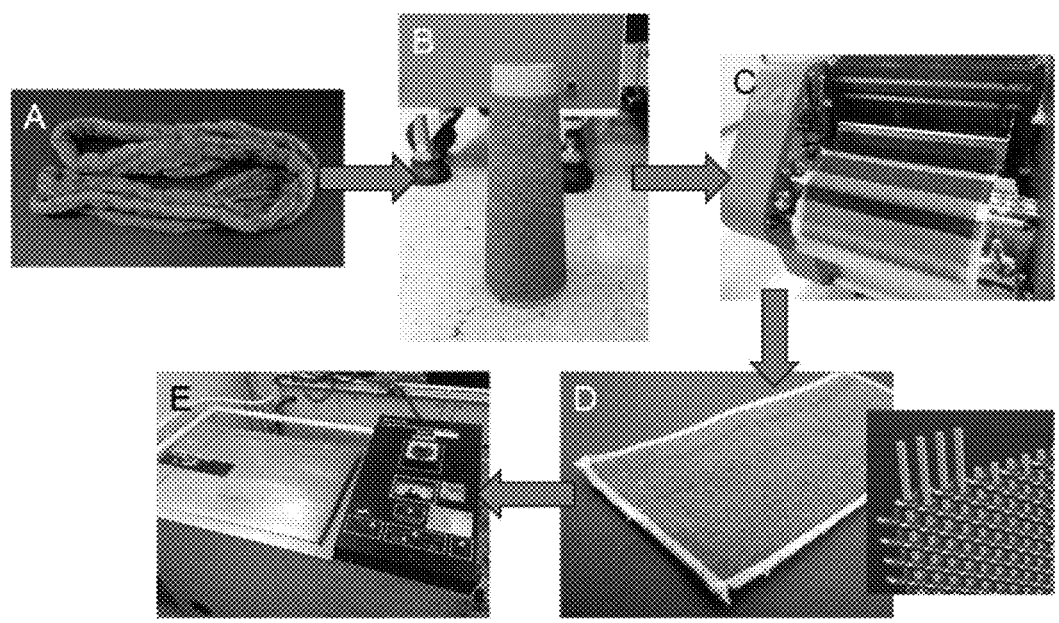
FIG. 7 depicts process steps for fabrication of a woven fabric formed from copper-coated yarns produced in accordance with an embodiment of the present invention.

The PMANa-grafted cotton is also able to be characterized by energy-dispersive X-ray spectroscopy (EDX). It is shown in FIG. 4 that polymerization of MANa leaves the cotton sample with a sodium element which indicates the presence of PMANa. Referring further to the FIG. 5 scanning electron microscopy (SEM) image, no obvious difference between the morphology on the surfaces of silanized cotton fiber surface and the raw cotton fiber surfaces may be visibly evident. However, after polymerization of PMANa upon the silanized cotton fiber surface, it is notable that a layer of coating had been wrapped on the cotton fiber surface. FIGS. 5D-F show that the copper metal particles are deposited relatively evenly, without any signs of cracks.

The conductivity of the copper-coated cotton yarns is able to be characterized by a two-probe electrical testing method. In this regard, linear resistance of the copper-coated yarns in the fabrication is found to be −1.4 Ω/cm as shown in FIG. 6A, and with superior tensile properties compared to the untreated cotton yarns, with both increase in tensile extension (+33.6%) and maximum load (+27.3%) as shown in FIG. 6B. The increase in tensile extension and maximum load is perceived to be due to the reinforcement on the strength of cotton yarns by a layer of copper.

To further test the adhesion of the copper on the cotton yarn surface and the washing durability, the copper-coated cotton yarns are first woven into a fabric first. As-synthesized copper-coated cotton yarns shown in FIG. 7A are firstly wound upon a cone as shown in FIG. 7B by use of an industrial yarn winder. Thereafter, the cone is transferred to a CCI weaving machine as shown in FIG. 7C whereby the copper-coated yarns are woven into a fabric. In the weaving setting, the copper-coated cotton yarns are configured to form the wefts of the fabric while the warps of the fabric are formed by the untreated cotton yarns as shown in the inset image of FIG. 7D which are initially mounted on the weaving machine. No problems or defects are found in the weaving process. After weaving, the fabric is cut into pieces of 5 cm×15 cm and overlocked at the four edges as shown in FIG. 7D, and subsequently, subjected to a series of washing cycles according to the testing standard AATCC Test Method 61—Test No. 2A: Colorfastness to Laundering, Home and Commercial: Accelerated (Machine Wash) (FIG. 7E) under following washing conditions:

| | |
|---|---|
| Washing Temperature | 49 ± 2° C. |
| Volume of DI Water | 150 mL |
| No. of Steel Balls Added | 50 pcs |
| Time of Washing | 45 minutes |

Figure 8:
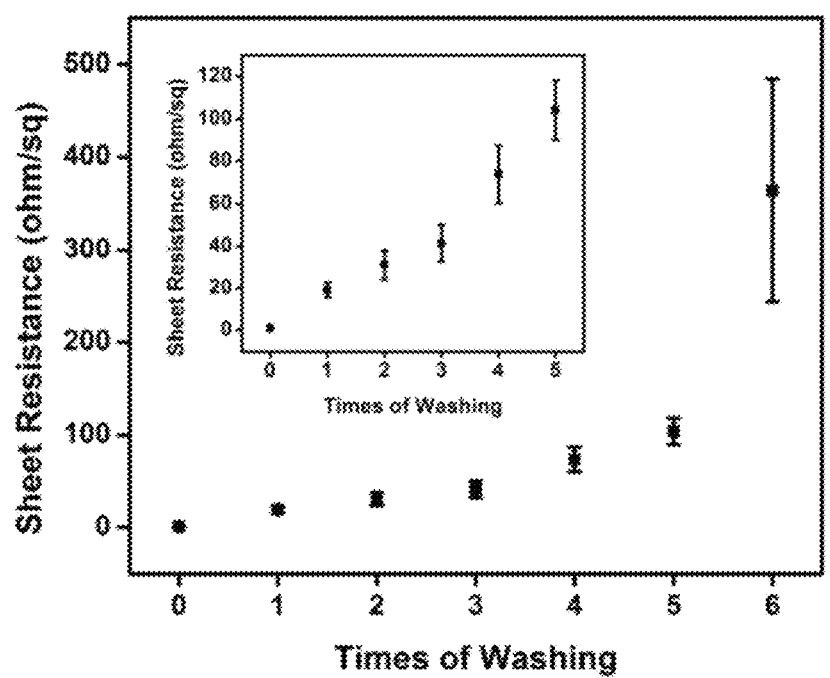
FIG. 8 depicts sheet resistance data of fabrics woven from copper-coated yarns produced in accordance with an embodiment of the present invention.
Figure 9:
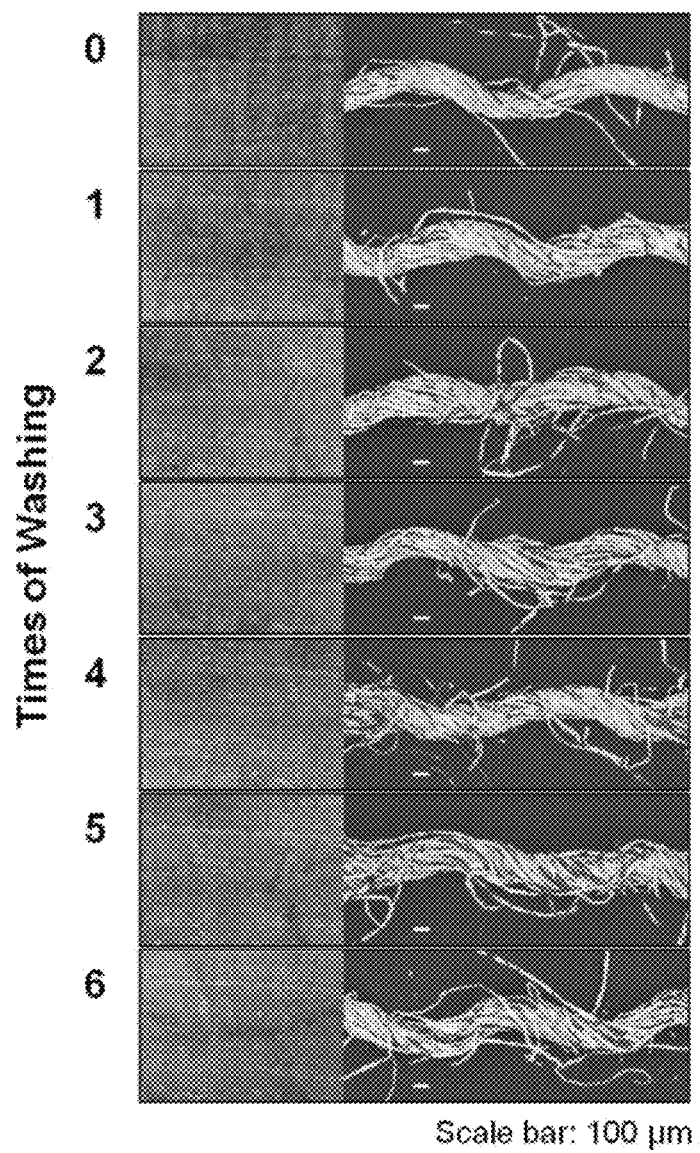
FIG. 9 depicts SEM images of cotton yarns unraveled from washed fabrics under different washing times, the cotton yarns being produced in accordance with an embodiment of the present invention.
Figure 12A:
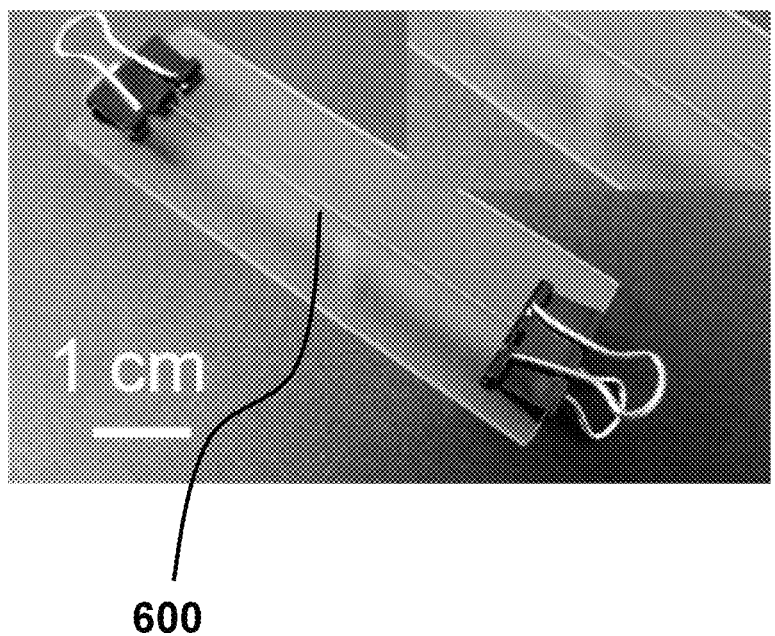
FIG. 12A depicts PAANa-assisted copper-coated nylon yarn produced in accordance with an embodiment of the present invention.
Figure 12B:
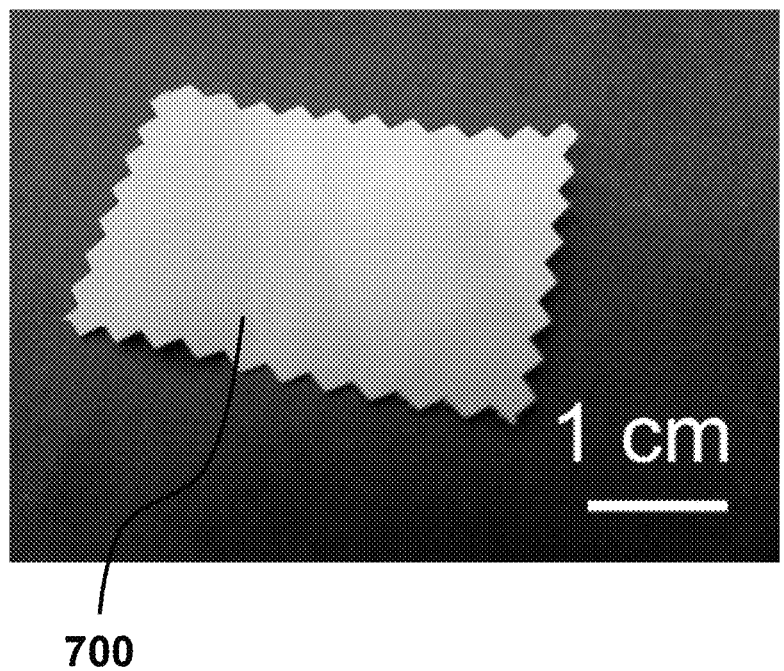
FIG. 12B depicts a polyester fabric formed from PAANa-assisted copper-coated nylon yarn produced in accordance with an embodiment of the present invention.

It should be noted that according to the testing standard, 1 washing cycle is equivalent to approximately 5 commercial machine laundering cycles. In total, 6 washing cycles are conducted, which accordingly, is considered to equate to approximately 30 commercial machine laundering cycles. Changes in the electrical resistance of the washed fabrics are able to be evaluated using a four-probe method whereby the sheet resistances of the fabrics produced in accordance with this embodiment are measured to be 0.9±0.2 ohm/sq (unwashed), and 73.8±13.4 ohm/sq after the fourth wash which is equivalent to approximately 20 commercial machine laundering cycles as shown in FIG. 8.

The surface morphology of the washed copper-coated cotton yarns are able to be characterized by unraveled the washed copper-coated cotton yarns from the fabric and examined under an SEM. As shown in the SEM images of FIG. 9, it is visibly evident that the copper metal particles are retained on the surface of the cotton fibers. One perceived reason for the increase in sheet resistance is due to the loosened structure of the cotton fibers arising from repeated washing cycles.

It is also noted that during application of the standard washing cycle to the produced fabric, 50 pieces of steel balls are added into the washing canisters in seeking to simulate vigorous rubbing and stretching forces of a laundering machine. The abrasion of the steel balls on the fabric impacts substantially upon the fiber structure. As the copper-coated cotton fibers are no longer held in a tightened manner it is perceived that they lose contact with each other so as to reduce electrically-conductive pathways available for the movement of electrons. Accordingly, the sheet resistance increases upon repeated washing cycles notwithstanding, the SEM images in FIG. 9 which confirm the relatively strong adhesion of copper metal particles on the cotton fiber surface.

In alternate embodiments of the present invention, rather than coating the cotton fibers with copper particles, nickel metal particles may instead be electrolessly plated on to the textile surface by using the same approach described above. Same experimental procedures and testing may be conducted however the source of nickel that may be utilised is 120 g/L nickel(II) sulphate solution in the ion exchange procedure. Subsequently an electroless nickel plating bath is utilised consisting of 40 g/L nickel sulphate hexahydrate, 20 g/L sodium citrate, 10 g/L lactic acid, and 1 g/L dimethylamine borane (DMAB) in water for 60-180 minutes. The sheet resistance of the resulting nickel-coated cotton fabric is found to exhibit substantially similar results as that of the copper coated fiber yarns as shown in FIG. 8. Turning to FIG. 10, an exemplary nickel-coated cotton fabric is represented by (300) which exhibits a high degree of evenness of nickel metal, with bulk resistance measured as 3.2Ω.

It will be appreciated that other embodiments of the present invention may involve the use of substrates other than cotton and could be suitably applied to various textile materials formed from natural or man-made yarn or fiber including for instance polyester, nylon, cotton, silk, viscose rayon, wool, linen yarns, fibers or combinations thereof. In this regard, an exemplary PAANa-assisted copper-coated yarn produced in accordance with an embodiment of the present invention is shown represented by (400) in FIG. 11A, an exemplary PAANa-assisted nickel-coated silk yarn produced in accordance with an embodiment of the present invention is shown represented by (500) in FIG. 11B, an exemplary PAANa-assisted copper-coated nylon yarn produced in accordance with an embodiment of the present invention is shown represented by (600) in FIG. 12A, and, an exemplary polyester fabric formed from PAANa-assisted copper-coated nylon yarn produced in accordance with an embodiment of the present invention is represented by (700) in FIG. 12B.

It will be appreciated from the preceding summary of the broad forms of the invention that various advantages may be conveniently provided including electrically-conductive textile elements may be produced which may be suitably flexible, wearable, durable and/or washable for integration into a textile/fabric. Moreover, such high performance electrically-conductive textile elements (fibers, yarns and fabrics) may be produced utilising relatively low-cost technology cost-effectively on a mass scale based upon the chemical reaction of in-situ free radical polymerization to grow negatively-charged polyelectrolytes such as PMANa or PAANa on textile substrates which may conveniently provide an improved negatively-charged polyelectrolyte layer bridging the electrolessly deposited metal and textile elements and substrates. Notably, the adhesion of electrically-conductive metal to textile substrates may be greatly improved by such surface modification of a layer of negatively-charged polyelectrolyte PMANa or PAANa, in which the electrical performance of such electrically-conductive textiles may be more reliable, robust and durable under repeated cycles of rubbing, stretching, and washing. Also, the in-situ free radical polymerization method used to prepare the negatively-charged polyelectrolyte may be performed under ambient and aqueous conditions without using any strong chemicals.

In another embodiment, a process and apparatus is provided which are used to produce silicon nano-particles from a raw silicon material. Different grades of raw silicon material may be utilised depending upon the purity of the silicon nano-particles that are required for a particular application. If the purity of the silicon nano-particles produced is of particular concern, for instance where the silicon nano-particles are to be used in solar panels, then a solar grade silicon raw material may be suitably used. If purity is not of particular concern, for instance if the silicon nano-particles are intended to be used for production of anodic or cathodic materials in batteries, then a metallurgical grade silicon raw material may instead be suitably used.

Figure 13:
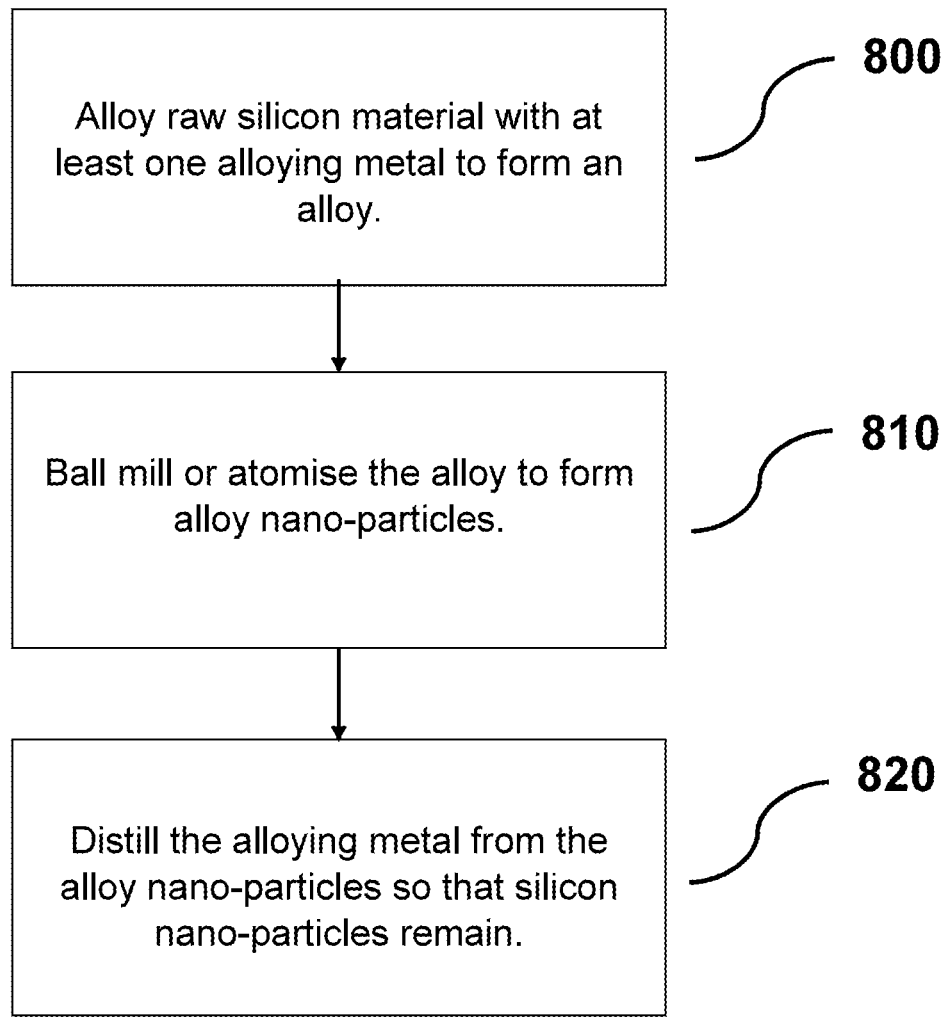
FIG. 13 shows a flowchart of process steps in accordance with an embodiment of the present invention for use in producing silicon nano-particles from a raw silicon material.
Figure 14:
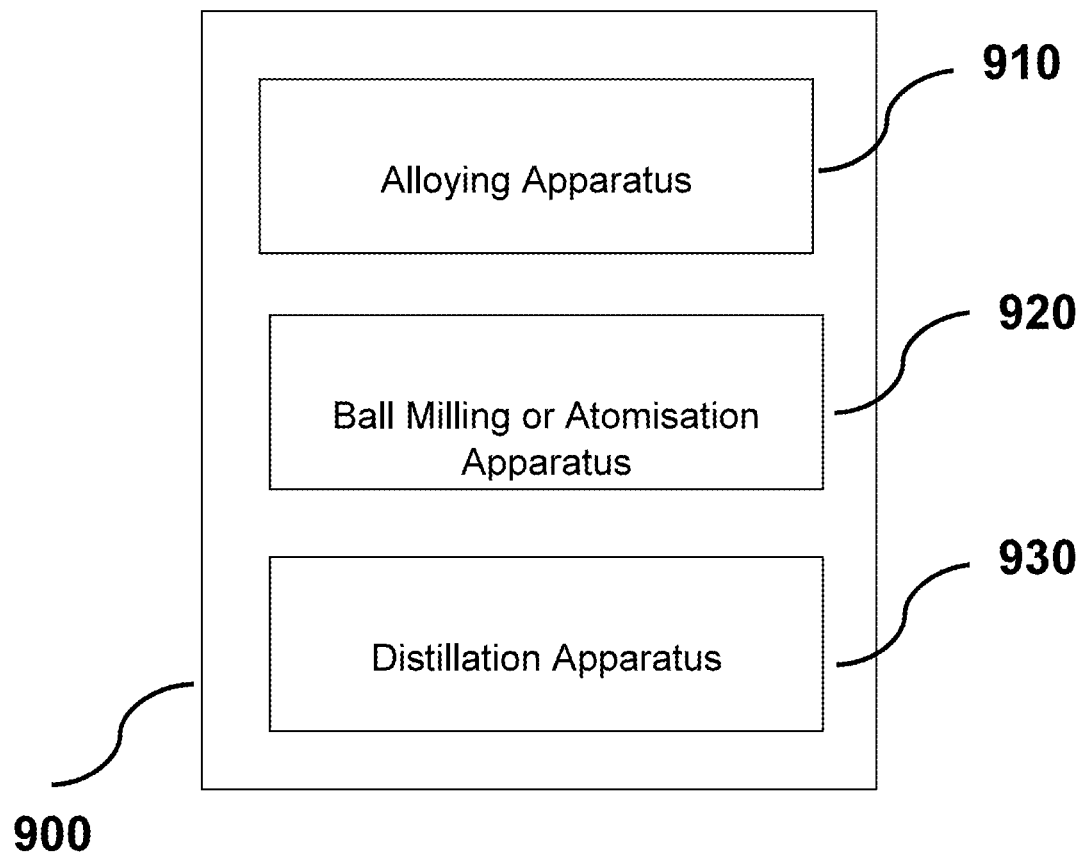
FIG. 14 shows a functional block diagram of an exemplary apparatus for use in performing process steps in accordance with embodiments of the present invention to produce silicon nano-particles from a raw silicon material.

Referring now to the process steps shown in FIG. 13 and the apparatus (900) shown in FIG. 14, the raw silicon material is firstly alloyed with any alloying metal that is able to be distillable from the alloy using an alloying apparatus (910), for instance magnesium or zinc. This step is represented by block 800 in FIG. 13. However, in these embodiments, the alloying metal which in is used is magnesium. The process of alloying the magnesium with the raw silicon material is performed under a vacuum conditions or otherwise in a controlled environment since magnesium is extremely flammable at high temperatures. The alloy is formed in proportions of approximately 53% (atomic percent) silicon and 47% magnesium. A lower percentage of silicon may be used in forming the alloy however the efficiency of the process is observed to lower significantly going forward. However, this ratio can be used to control the size of the final nano-silicon. Zinc, or a combination of both magnesium and zinc, may also be used as the alloying metal in other embodiments as the alloying metal as the metals are distillable in both situations. Once formed, the alloy will typically be in the form of ingots.

Any suitable processing step may be employed to break the alloy ingots into alloy particles of approximately in the range of around 100 nm-150 nm in diameter. This step is represented by block 810 in FIG. 13. In this embodiment, the alloy ingots are broken down in to alloy nano-particles in a ball milling apparatus (920). A controlled medium is used during the step of ball milling the alloy ingots into the nano-particles to alleviate oxidisation during the ball milling process which if milled in an uncontrolled medium may in an extreme scenario result in an explosion, and/or, may affect the integrity of the silicon nano-particles as silicon will be oxidised. To provide such a controlled medium, the milling chamber may for instance be filled with an inert gas, oil, diesel, or kerosene, dehydrated ethanol (i.e. all organic oils/surfactants/solvents), N-Methyl-2-pyrrolidone ("NMP"), other suitable organic solvents, or any combination thereof to alleviate risk of oxidisation arising. It should be noted that if the silicon nano-particles to be produced in accordance with this embodiment are to be used in application such as solar panels where purity is relatively solar purposes, oils should not be used to fill the milling chamber as the milling medium. Instead, the milling medium is a vacuum either, filled with Argon gas, or filled with dehydrated ethanol. Preferably dehydrated ethanol may conveniently be used as this will serve as a protective medium during the transit of the alloy nano-particle powders from the milling chamber to a distillation chamber where the alloy nano-particles will subsequently undergo distillation to remove the alloying metal(s) from the alloy nano-particles.

In alternate embodiments, it may be possible to form the alloy nano-particles from the alloy when in the form of a liquid solution by use of a metallurgical atomisation process. Conveniently, in accordance with this process, the particle size of the alloy nano-particles are able to be suitably controlled. The process of forming the alloy nano-particles is a relatively more costly process, however the step of distillation during the entire production process may also serve as an annealing cycle, hence growing grains in the amorphous particles, which may result in production of silicon nano-particles of suitable performance for use in solar cell applications.

After forming the alloy nano-particles of approximately in the range of around 100 nm-150 nm in diameter by utilizing either ball-milling or atomisation processes, the alloying metal(s) are distilled from the alloy nano-particles using a distillation apparatus (930) so that silicon nano-particles of approximately in the range of around 50 nm-150 nm in diameter remain. This step is represented by block 820 in FIG. 13. The distillation process is performed by transferring the alloy nano-particles in to a vacuum furnace. Where the alloy ingots have been balled-milled in a milling chamber with an oil filling the milling chamber as the milling medium, the oil that has been transferred with the alloy nano-particles from the milling chamber into the vacuum furnace will first be evaporated or 'burnt' at a temperature of approximately around 460° C. The temperature in the vacuum furnace is then raised to around approximately 760° C. at 6 Pa vacuum in order to distill the alloying metal from the alloy nano-particles. The varying of temperatures in the vacuum chamber may assist in increasing surface area of the resulting nano-particles which may be useful in both solar cell applications as well as applications where the silicon nano-particles are used to provide anodic or cathodic material for batteries. The silicon nano-particles resulting after the vacuum furnacing step is performed are of approximately in the range of 50 nm-150 nm in diameter due to the mass and weight difference of magnesium and Si. In certain embodiments, a further optional step following distillation may be effected in which the silicon nano-particles may be subjected to a further milling process in a controlled environment to break apart a porous structure comprised by the nano-silicon particles. Preferably the controlled environment may include filling the milling chamber with dehydrated ethanol. In certain embodiment, this step will differ in that the ingots are processed to be of the same size to eliminate variations of the quality of distillation. The step of distillation advantageously creates pores within the silicon nano-particles and by using different percentages of Mg or Zn (as example, distillable metals) in the alloy, it is possible to control the porosity of the final nano-particles produced as exemplified by the SEM and BET images/data drawings. These pores in the surfaces of the silicon nano-particles may be particularly useful in applications where the silicon nano-particles are used to form the anodic or cathodic material of battery devices. That is, these pores may assist in reducing expansion of the anodic or cathodic material during charging and discharging of the battery. The ability to controllably produce the pores on the surfaces of the silicon nano-particles is also advantageous in that the presence of such pores provides additional stiffness to an anodic or cathodic structure formed from such nano-particles. This is analogous to the way in which an I-beam provides relatively greater structural stiffness than a regular block of steel due to its structure.

In an alternate embodiment, the process of producing silicon nano-particles from a raw silicon material may involve a different sequence of processing steps to that as described above. The raw silicon materials is firstly alloyed with an alloying metal such as magnesium or zinc to form alloy ingots. The alloy ingots are distilled to produce porous pure silicon ingots which are then ball-milled to produce silicon ingots approximately in the range of around 50 nm-150 nm in diameter. Before the alloy ingots are distilled, the ingots may first be processed to form pellets of around 1 cm in diameter. The silicon nano-particles of approximately in the range of around 50 nm-150 nm in diameter are produced by this process may be utilised for instance in applications as a anodic or cathodic material of a battery. Such anodic or cathodic material may comprise a flexible fabric upon which the silicon nano-particles are coated or otherwise bonded to, or, may be mixed with a conventional carbon-based anode.

Figure 16:
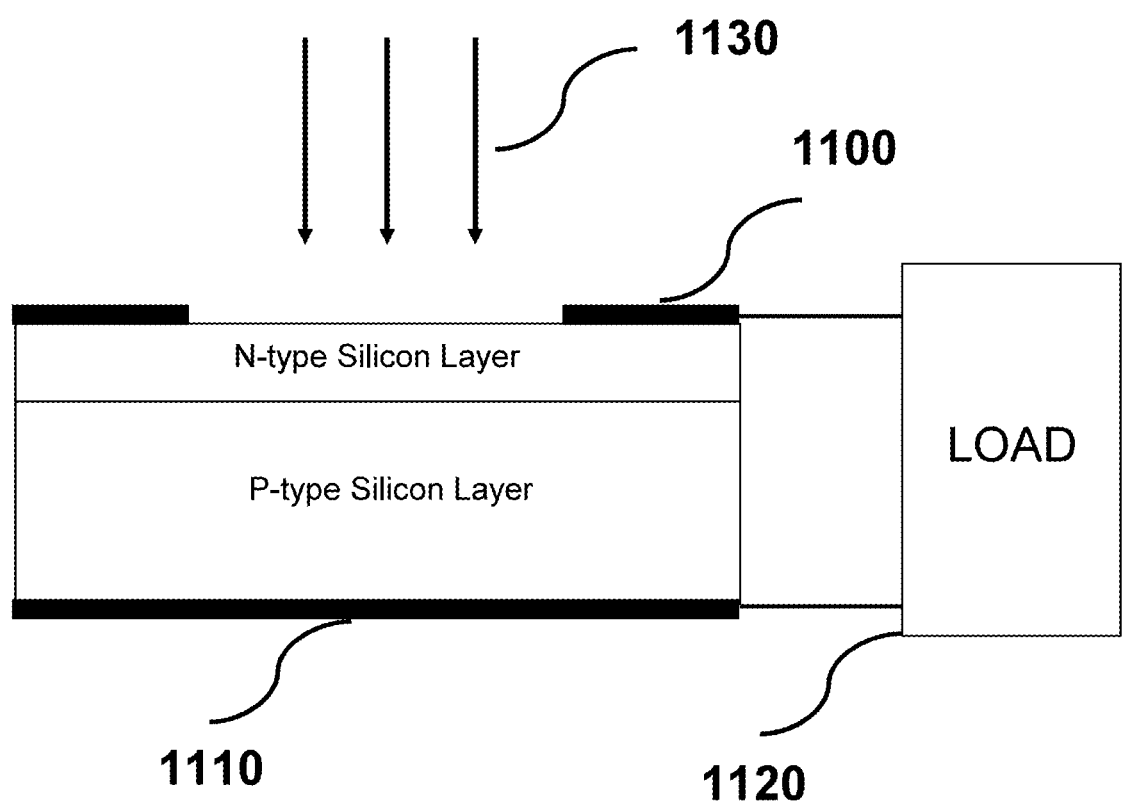
FIG. 16 shows a cross-sectional view of a basic solar cell device structure manufactured in accordance with an embodiment of the present invention.

In a further embodiment of the present invention, a solar cell device is provided for converting solar energy to electricity. FIG. 16 shows a basic functional structure of a solar cell device manufactured in accordance with an embodiment of the present invention comprising a photosensitive element having an n-type layer contiguously connected with a p-type layer at a junction region therebetween. The n-type layer and contiguously connected p-type layer of the photosensitive element are configured so that, when solar energy in the form of photons (1130) bombard the n-type layer of the photosensitive element, the energy of the photons frees electrons in the lower p-type layer which may then cross the junction region to the n-type layer and flow through a load device forming an external electrical circuit between the p-layer and n-layer of the photosensitive element. Electrically-conductive terminals (1100,1110) are also disposed on the n-type layer and the p-type layer to which the load device (1120) may be connected to form the external electrical circuit between the n-type and p-type layers. In certain embodiments, the electrically-conductive terminals (1100, 1110) may comprise a layer of aluminium.

Figure 17:
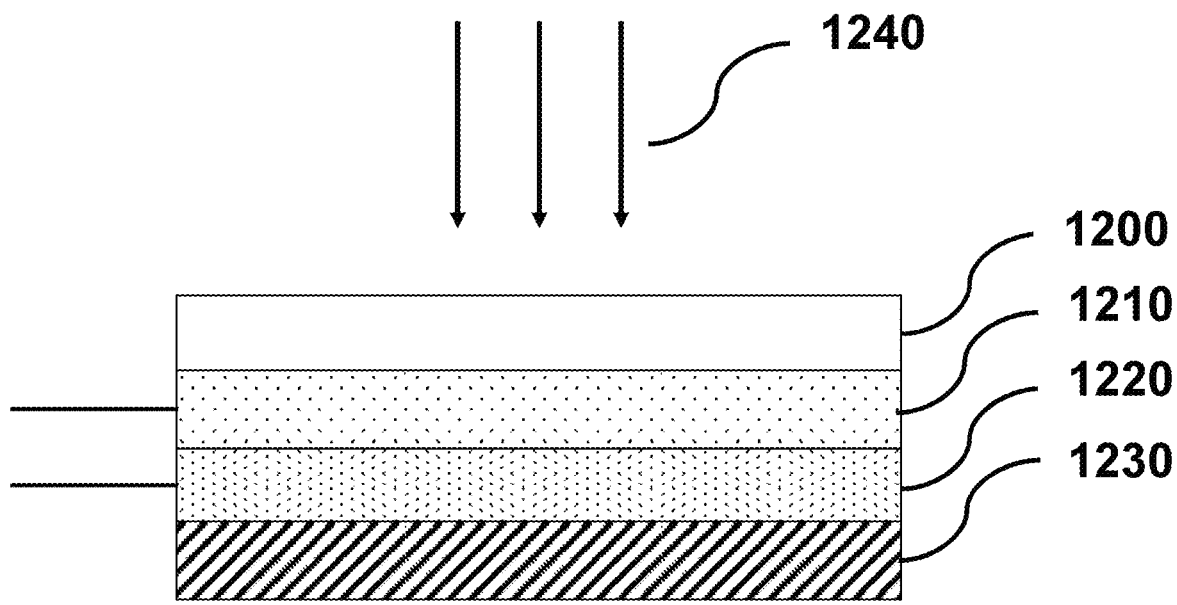
FIG. 17 shows a cross-sectional view of a preferred embodiment solar cell device structure manufactured in accordance with an embodiment of the present invention wherein p-type and n-type layers are printed or coated on first and second electrically-conductive fabric layers respectively.
Figure 19:
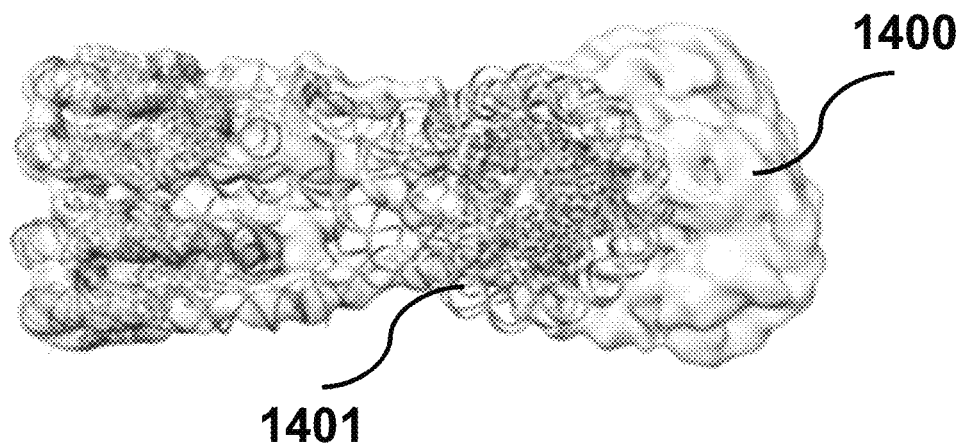
FIGS. 19-22 shows examples of silicon nano-particles encapsulating and being trapped by on a surface structure of an electrically-conductive textile element of a fabric as used in applications such as solar cells devices and as an anode element of a battery device.
Figure 20:
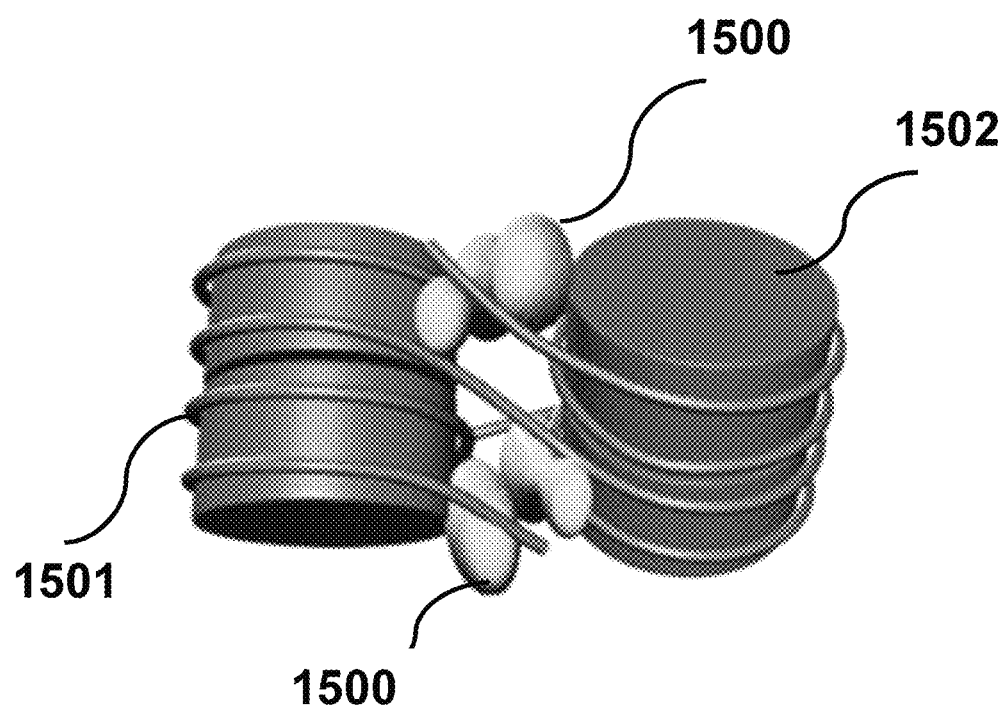
Figure 21:
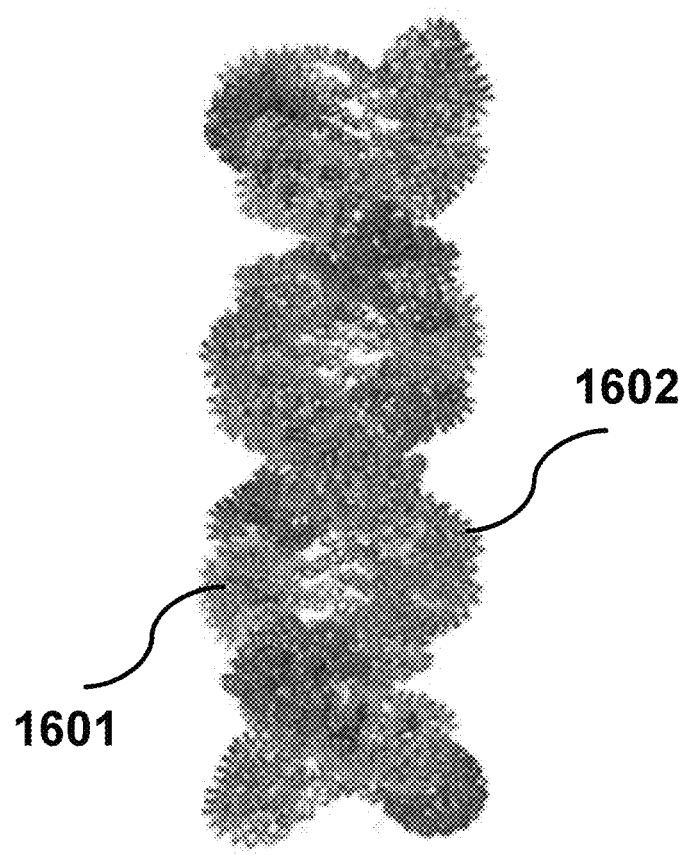
Figure 22:
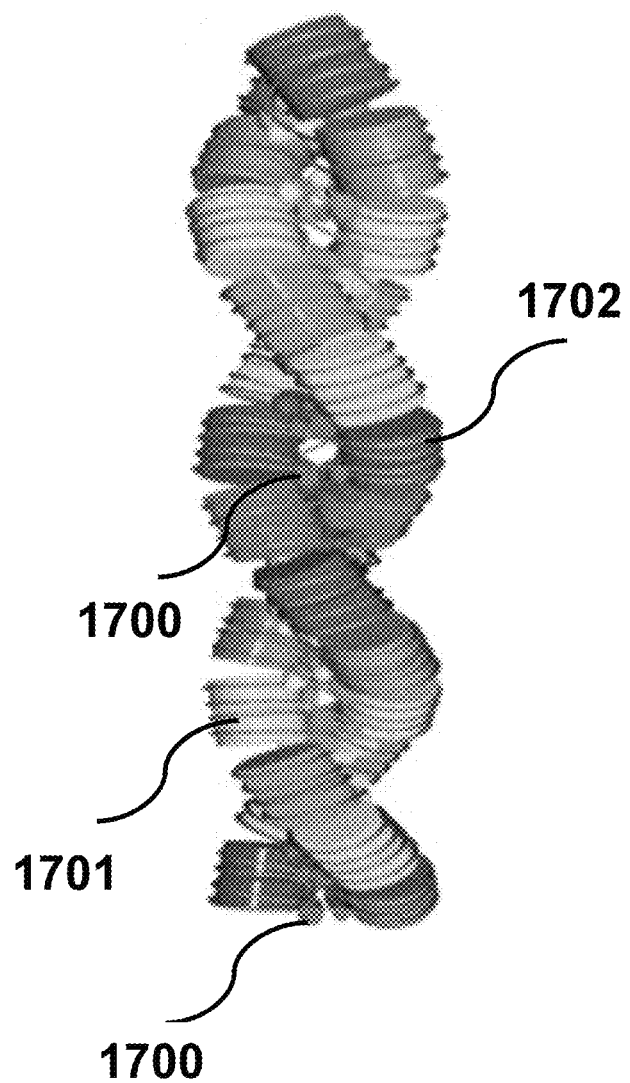
Figure 24:
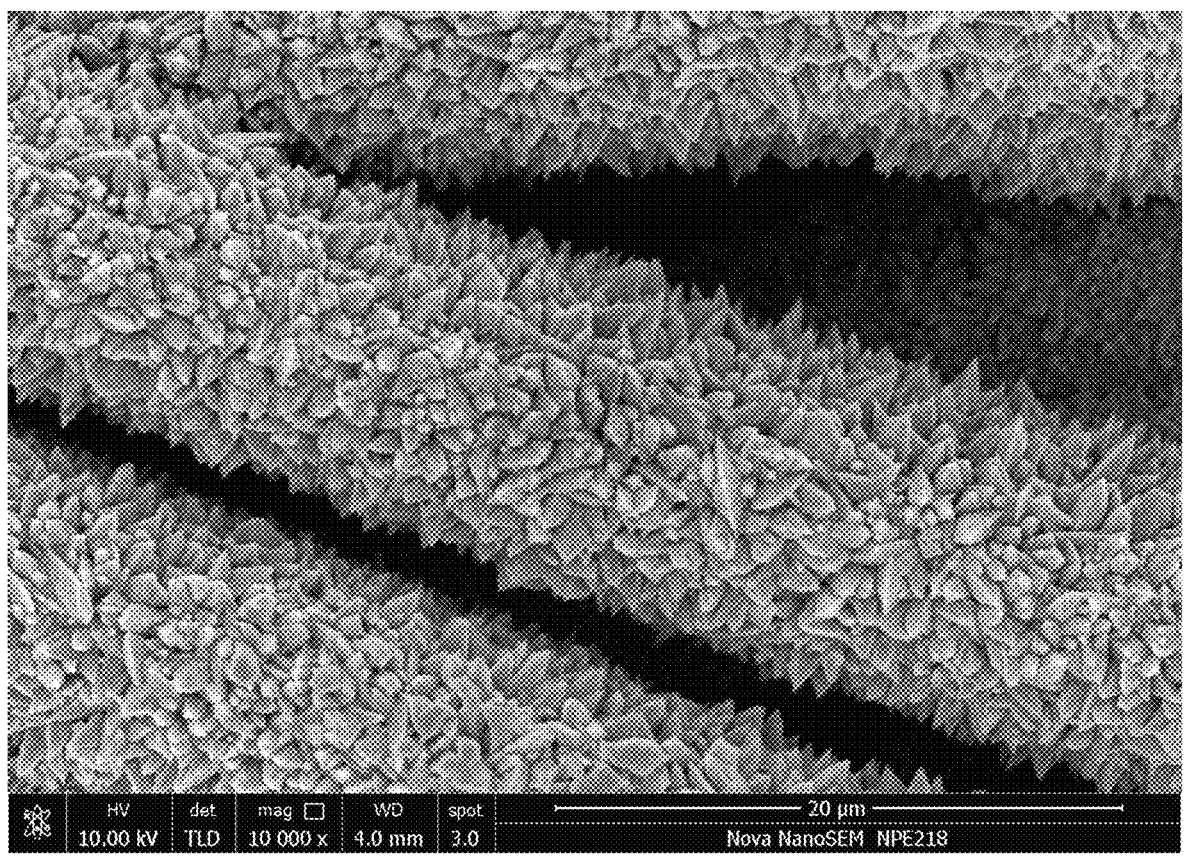
FIG. 24 shows an SEM image of an electrically-conductive textile element (e.g. a fiber or thread) which may be used to form an electrically-conductive substrate (e.g. a fabric layer), and the electrically-conductive textile element including a dendritic-type copper-coated surface structure having "pockets" within which silicon nano-particles deposited on to the surface may be trapped/entangled.
Figure 25:
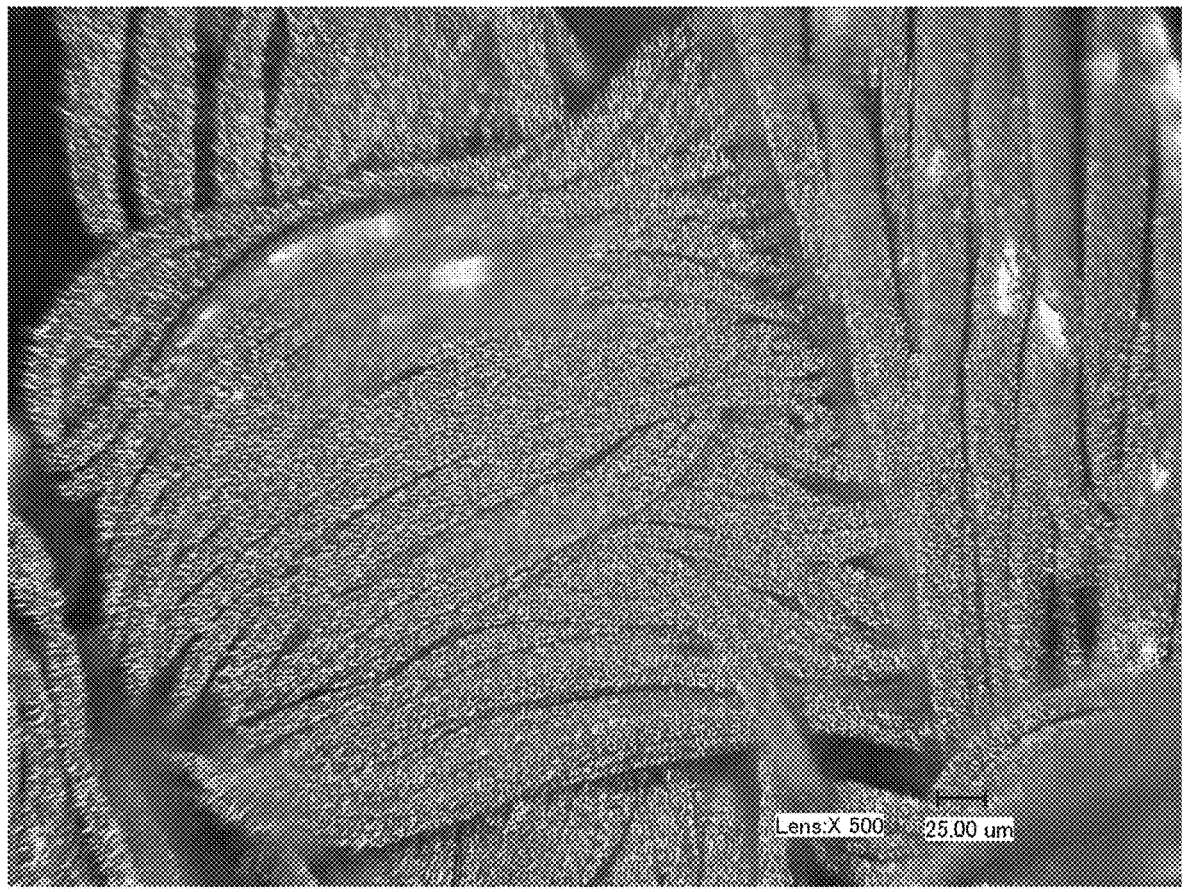
FIG. 25 shows an SEM image of an electrically-conductive textile element (e.g. a fiber or thread) which may be used to form an electrically-conductive substrate (e.g. a fabric layer), and the electrically-conductive textile element including a lattice-type copper-coated surface structure having "pockets" within which silicon nano-particles deposited on to the surface may be trapped/entangled.

Referring now to FIG. 17, a preferred embodiment of a solar cell device is shown in which the n-type layer (1210) and the p-type layer (1220) are formed from a first fabric layer and a second fabric layer respectively having silicon nano-particles thereon using any suitable deposition technique. The first and second fabric layers are comprised by electrically-conductive synthetic or non-synthetic yarns (or any blend or composite structure thereof) that have been inter-woven together in accordance with any of the embodiments described above. Advantageously, the deposited silicon nano-particles are trapped within a surface structure of the electrically-conductive textile elements whereby the surface structure may include a dendritic-type or lattice-type structure having "pockets" formed by a coating of metal particles that are suited for being filled up by and trapping the silicon nano-particles therein. Furthermore, the silicon nano-particles may encapsulate the surface structure of the electrically-conductive textile elements. FIG. 19 shows an example of how a fabric layer formed from electrically-conductive fibres (1401) may be encapsulated by a mass of silicon nano-particles (1400) deposited on the fabric layer. FIG. 20 further shows an example of how silicon nano-particles deposited on the structure of the fabric layer may be entangled within the structure of two different kinds of electrically-conductive textile fibres (1501,1502) woven together to form the fabric layer. FIG. 21 shows a further example of how two different textile thread structures may be configured to form a helical type structure within which silicon nano-particles deposited thereon may conveniently encapsulate and/or be entangled within the structure. FIG. 22 shows a further example in close-up view of textile elements of varying diameters being wrapped about each other to form a first composite thread (1701), textile elements of varying diameters being wrapped about each other to form a second composite thread (1702), and the first and second composite threads (1701,1702) further being configured to be intertwined around each other to form a helical type configuration. Silicon nano-particles may be conveniently entangled within or encapsulate the structures of the individual composite threads (1701,1702) themselves, or, may be entangled within or encapsulate the overall helical type configuration comprising the first and second composite threads (1701,1702). Returning to the present example, the copper coating of the electrically-conductive yarns of the electrically-conductive first and second fabric layers may include dendritic structures (e.g. such as shown in the SEM image "F" of FIG. 5) whereby the silicon nano-particles that are deposited on to the first and second fabric layers may conveniently rest within the "pockets" of the dendritic structures. FIGS. 24 and 25 further depict SEM images of electrically-conductive textile elements (e.g. a fiber or thread) which may be used to form an electrically-conductive substrate (e.g. a fabric layer), wherein the and the electrically-conductive textile elements can be seen to include a dendritic-type surface and lattice-type copper-coated surface structure respectively having "pockets" within which silicon nano-particles deposited on to the surfaces may be trapped/entangled.

Figure 15:
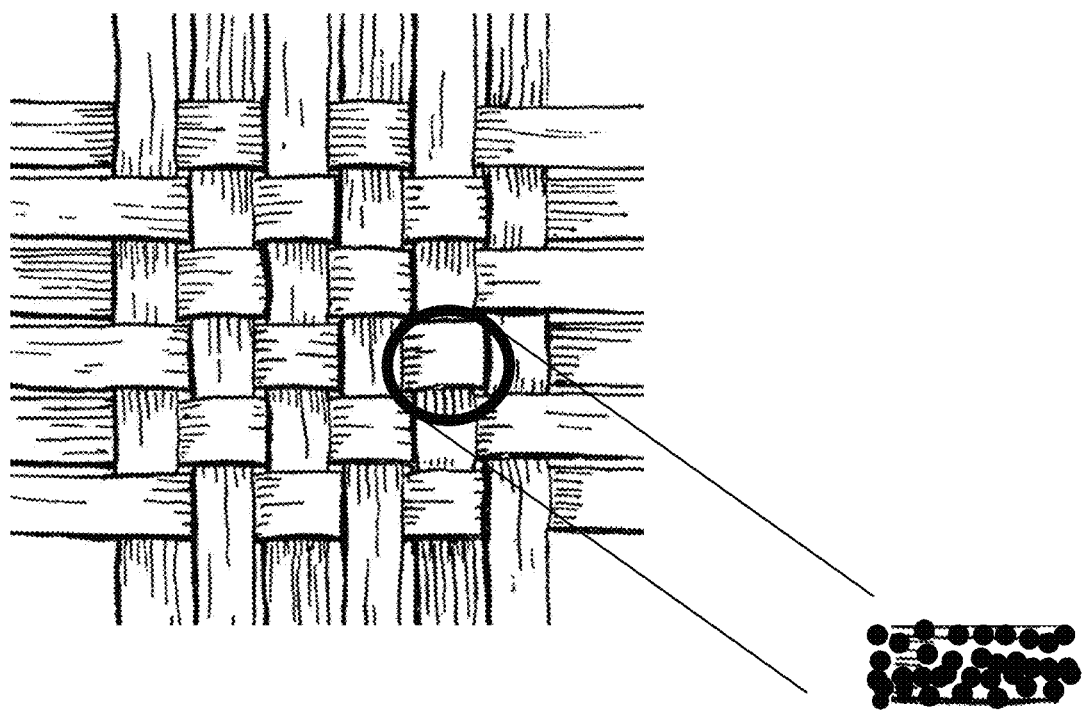
FIG. 15 shows a top view and magnified view of an example fabric comprising inter-woven electrically-conductive yarns (e.g. copper coated cotton yarns), the fabric having silicon nano-particles printed or coated thereon for application as a p-type or n-type layer of a solar cell.

A supersonic deposition technique may be employed to assist in the deposited silicon nano-particles penetrating and being trapped within the pockets of the surface structure of the yarns and fibers of the fabric layers. FIG. 15 shows an exemplary electrically-conductive fabric structure formed for instance from interwoven copper-coated cotton yarns. A section of the fabric is shown in magnified view with silicon nano-particles printed or coated uniformly on to the surface of the fibers which form the fabric structure. The silicon nano-particles deposited on to the fabric layers are suitably doped with impurities so as to provide the n-type or p-type characteristics of the respective layers. Conveniently, the copper-coated first and second electrically-conductive fabric layers not only provide a flexible structure for formation of the n-type and p-type layers (1210,1220) but may also provide dual functions as the electrically-conductive terminals of the n-type and p-type layers (1210,1220) without requiring additional electrically-conductive terminals, films or contacts to be fabricated upon the n-type and p-type layers (1210,1220). Protective layers may also be formed adjacent to surfaces of the n-type layer and p-type layer (1210,1220) to provide these layers with protection from damage. The protective layer formed adjacent the n-type layer is formed from a suitably flexible transparent material such as ethylene-vinyl acetate (EVA) type material or the like so that this does not restrict photons from contacting with the photosensitive element. The dimensions and properties of any protective layers that are formed adjacent the n-type layer or p-type layer will be suitably selected so as to not comprise the working spectrum of light that may be incident upon these layers.

Figure 18:
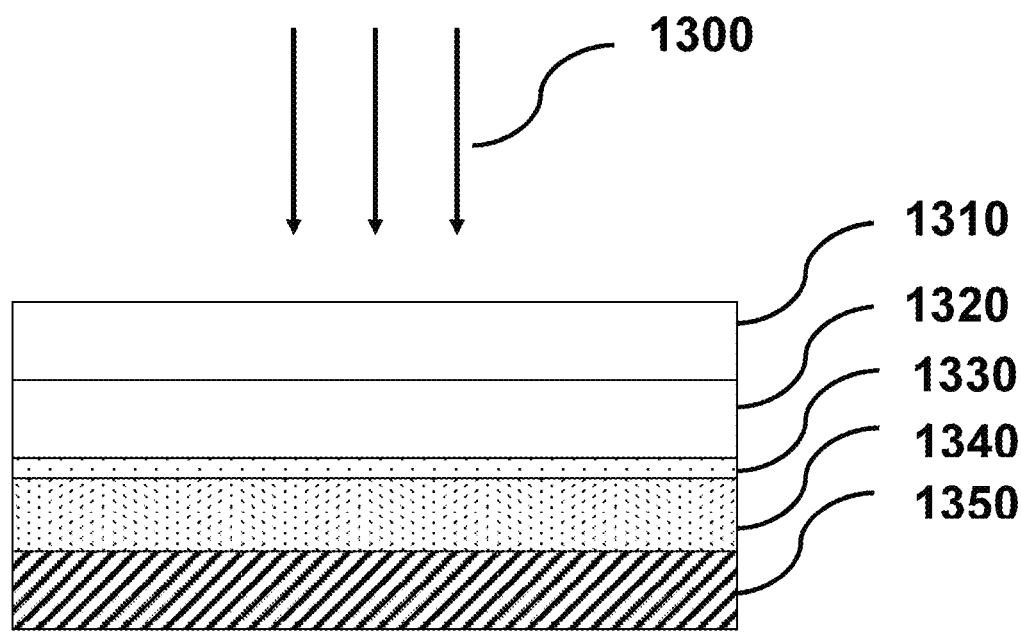
FIG. 18 shows a cross-sectional view of another preferred embodiment solar cell device structure manufactured in accordance with an embodiment of the present invention wherein p-type and n-type layers are printed or coated on a single electrically-conductive fabric layer.

In another preferred embodiment, the solar cell device may be formed on a single fabric layer as shown in FIG. 18. The fabric layer includes a thickness of approximately 50 microns or less. As in the example above, the fabric layer is also comprised by electrically-conductive synthetic or non-synthetic yarns that have been inter-woven together. In this embodiment, the fabric layer is firstly coated with p-type silicon nano-particles of solar grade purity so as to form the p-type layer (1340) of the photosensitive element of the solar cell. Then on a first surface of the p-type layer (1340), n-type silicon nano-particles are printed or coated thereon to form the n-type layer (1330) of the photosensitive element. A transparent electrically-conductive oxide layer (1320) is then formed on a surface of the n-type layer (1330) so as to sandwich the n-type layer (1330) between it and the p-type layer (1340). The transparent electrically-conductive oxide layer (1320) serves as the electrically-conductive terminal of the n-type layer (1330) whilst the electrically-conductive fabric serves as the electrically-conductive terminal of the p-type layer (1340). A load device when connected between these two electrically-conductive terminals forms an external electrical circuit via which electric current may flow between the n-type and p-type layers (1330,1340) when the photosensitive element is bombarded by photons. A transparent protective layer (1310) formed from EVA is also formed on the transparent electrically-conductive oxide layer (1320) as shown to protect the oxide layer from damage. A protective layer (1350) is similarly formed on the p-type layer (1340) as shown in FIG. 18.

In the above-described solar cell device embodiments, the silicon nano-particles that are used are produced in accordance with silicon nano-particle production processes of embodiments described herein. However, it would be understood that silicon nano-particles produced in accordance with any other process may also be used. Furthermore, in alternate embodiments the n-type and p-type layers may be formed from other suitably doped n-type and p-type nano-particles, not necessarily being silicon nano-particles.

In alternate embodiments of the present invention in which a solar cell device is provided comprising silicon nano-particles, the solar cell device may not require the silicon nano-particles to be doped to form a p-layer, an n-layer and a p/n junction region therebetween. In such alternate embodiments, the solar cell includes a current generation module comprising a hole donor element and an electron donor element configured for generation of the electrical current in response to the current generation module being exposed to solar energy. The first electrically-conductive terminal includes an electrically-conductive substrate having silicon nano-particles disposed thereon configured to function as the hole donor element, and, the second electrically-conductive terminal includes an electrically-conductive substrate having silicon nano-particles disposed thereon configured to function as the electron donor element of the current generation module. When excited by exposure to solar energy, the first and second electrically-conductive terminals having the silicon nano-particles disposed thereon are configured to suitably function as the hole donor and electron donor respectively for generation of the electrical current of the solar cell device.

Figure 23A:
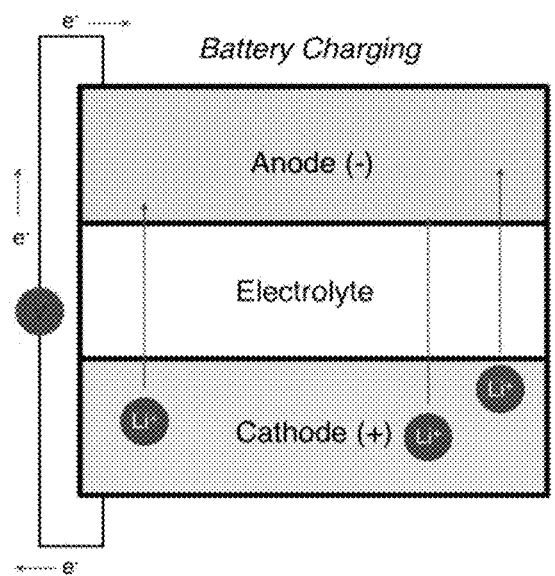
FIGS. 23A-23B depicts basic functional diagrams of a battery device during charging and discharging cycles.
Figure 23B:
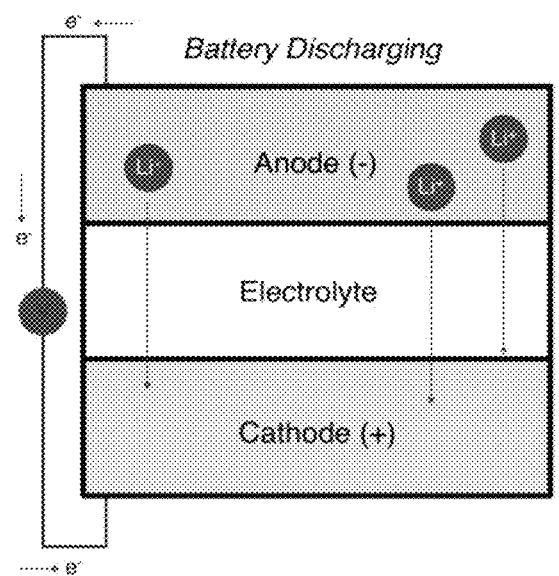

In yet a further embodiment of the present invention, a battery device is provided as shown in the basic functional diagram of FIG. 16. In contrast to certain traditional battery devices which utilise a carbon material as the anode to assist in effecting energy storage, in this embodiment, the anode element comprises an electrically-conductive substrate (which for example may be a copper-coated fabric) upon which is deposited silicon nano-particles. The fabric may for instance comprise woven cotton yarns although the structure of the fabric may be formed from any other suitable natural or man-made textile elements including for instance polyester, nylon, cotton, silk, viscose rayon, wool, linen, or any blend or composite structure thereof. Copper particles are coated on to the fabric, for instance, in accordance with any of the embodiment processes described herein. It would be appreciated that the copper particles may be coated directly on to the woven textile elements forming the fabric after the fabric has been formed, however, the copper particles may be coated on to the textile elements (yarns, fibers etc), before the textile elements have been formed into the fabric by weaving or any other suitable fabric formation technique. Silicon nano-particles are deposited on to the surface structure of the electrically-conductive textile elements of the fabric such that the silicon nano-particles encapsulate the surface structure of the fabric and/or are entangled within the yarns of the fabric. A supersonic beam may be utilised during deposition of the silicon nano-particles on to the fabric in seeking to assist in the deposition of the silicon nano-particles on to the fabric whereby the silicon nano-particles are trapped within pockets or other recesses formed in the surface structure of the textile elements. Advantageously, a higher percentage of deposition of the silicon nano-particles on to the copper-coated fabric will result in greater energy storage capacity of the anodic element. Also, because the silicon nano-particles encapsulate, penetrate and are entangled within and/or between the surface structures of the electrically-conductive textiles of the fabric substrate as shown in FIGS. 22 and 23, this alleviates damage due to expansion of silicon during battery charging. For instance, cracking in the silicon nano-particle coating is alleviated which makes it more difficult for moisture to penetrate and damage the encapsulated electrically-conductive textile elements of the anode.

It would be understood that these embodiments of the present invention are not limited to the example structures and geometries of the fabric or textile elements described herein and may take the form of other suitable structure and geometries of the fabric of textile elements without departing from the spirit of the present invention. For instance, in alternate embodiments, a fabric may be provided comprising first conductive fibres having a first type of particle deposited thereon (for instance n-type silicon nano-particles), and, second conductive fibres having a different type of particles deposited thereon (for instance p-type silicon nano-particles) may then be wrapped around the first conductive fibres, or vice versa. Between the first and second conductive fibres of this composite-type yarn, there may be provided a layer to assist in facilitating electron and hole transfer to close the circuit between the first and second conductive fibres.

It is further envisaged that an electrically-conductive fabric formed in accordance with any embodiments described herein may be utilised as a mesh filter in the ball milling process when producing the silicon-nano particles. It is possible to configure the process such that silicon nano-particles of a certain diameters may readily pass through the mesh structure of the fabric in the normal course of the milling process whilst silicon nano-particles of a desired diameter may be trapped on the surface structure of the electrically-conductive fabric being used as the mesh filter. Conveniently, this process provides a dual function in terms of both filtering silicon nano-particles of certain diameters during the milling process whilst simultaneously providing coating of electrically conductive fabrics with silicon nano-particles which may thereafter be used as substrates in various embodiments of the present invention.

It would be appreciated that embodiments of the present invention may assist in providing at least one of the following advantages:

(a) a relatively simple, expedient and scalable process may be provided by certain embodiments for producing solar-grade silicon nano-particles compared to certain technologies and processes currently available in the existing art;

(b) a relatively cost-effective and scalable process may be provided by certain embodiments for producing solar-grade silicon nano-particles in comparison to certain technologies, and consequently, the cost of manufacturing devices such as solar cells and anodic materials of batteries which comprise silicon nano-particles may therefore be reduced;

(c) in the processes of the embodiments for producing nano-silicon particles, the step of distillation advantageously creates pores within the particle or ingot depending on the order in which the steps of the processes are performed—that is Sequence 1

(i) Alloy raw silicon with (distillable) alloying metal to form alloy ingots;

(ii) Process the ingots (e.g. ball mill the ingots) into alloy nano-particles of about 100 nm-150 nm;

(iii) Distil the alloying metals from the allow nano-particles to produce the silicon nano-particles; and (iv) Further ball mill the silicon nano-particles to break apart the porous structure in surfaces of the silicon nano-particles.

OR

Sequence 2

(i) Alloy the raw silicon material with at least one alloying metal to form alloy ingots;

(ii) Distill the alloy ingots to produce porous silicon ingots; and (iii) Process the porous silicon ingots to form silicon nano-particles.

Moreover, by using different percentages of Mg or Zn (distillable metals) in the alloy, it is possible to control the porosity of the final nano-particles produced as exemplified by the SEM and BET images/data drawings. These pores are particularly useful as these pores reduce the expansion during charging and discharging for instance when the silicon nano-particles are being used as an anodic material of a battery. The ability to controllably produce the pores on the surfaces of the silicon nano-particles is also advantageous in that the presence of such pores provides additional stiffness to an anodic structure formed from such nano-particles. This is analogous to the way in which an I-beam provides relatively greater structural stiffness than a regular block of steel due to its structure.
(d) an electrically-conductive substrate comprising electrically-conductive textile elements coated by silicon nano-particles may be utilised as a novel component in solar cell devices which may improve impact resistance, ease of storage, transportation, installation and replacement due to the flexibility, compactness and reduced weight of the novel component which may be conveniently folded, rolled up and/or stacked; and
(e) an electrically-conductive substrate comprising electrically-conductive textile elements coated by silicon nano-particles may be utilised as a novel anodic element of rechargeable battery devices. Conveniently silicon nano-particles may fill up and be trapped within the pockets, spaces and faults of the surface structures of the electrically-conductive substrate, and, may be trapped between the surface structures of adjacent textile elements of the electrically-conductive substrate. The ability of the silicon nano-particles to fill up and be trapped within the surface structures of the electrically-conductive textiles elements allows for a greater amount of silicon to be provided in the anode element which thereby improves energy storage capacity of the battery. Also, by virtue of the manner of encapsulation of the electrically-conductive textile elements by the silicon nano-particles, problems (such as cracking) associated with expansion of the silicon nano-particles during charging of the battery may be alleviated. This solution teaches away from existing approaches as it does not seek to reduce the amount of silicon in the anode element and thus does not compromise the potential storage capacity of the battery, and, this solution does not seek to only partially charge the battery to alleviate silicon expansion and thus does not encourage inefficient usage of the potential storage capacity of the battery.

It would be understood and appreciated that the process of making the anode may well be extended to the making of the cathode, thus making a flexible battery with relatively higher energy storage capacity and lighter weight compared to traditional batteries.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A process for producing porous silicon nano-particles from a raw silicon material, the process including steps of:
   (i) alloying the raw silicon material with at least one distillable alloying metal selected from zinc and magnesium to form an alloy;
   (ii) milling the alloy to form alloy nano-particles of 100 nm-150 nm in diameter, said milling being performed in a milling chamber comprising an inert gas or an organic solvent to alleviate oxidation of the alloy;
   (iii) distilling the alloying metal from the alloy nano-particles so that porous silicon ingots comprised of nano-particles are produced; and
   (iv) milling the porous silicon ingots to break the porous silicon ingots apart to produce the porous silicon nano-particles.

2. The process as claimed in claim 1 wherein step (ii) includes ball milling the alloy to form the alloy nano-particles.

3. The process as claimed in claim 1 wherein the milling chamber comprises at least one of an inert gas, oil, diesel, kerosene and dehydrated ethanol.

4. The process as claimed in claim 1 wherein the alloy is in a liquid form and step (ii) includes atomisation of the alloy to form the alloy nano-particles.

5. The process as claimed in claim 1 wherein step (iii) includes distilling the alloying metal from the alloy nano-particles in a vacuum furnace.

* * * * *